(12) United States Patent
Chen et al.

(10) Patent No.: US 10,720,708 B2
(45) Date of Patent: Jul. 21, 2020

(54) ANTENNA DEVICE

(71) Applicant: InnoLux Corporation, Miao-Li County (TW)

(72) Inventors: Huei-Ying Chen, Miao-Li County (TW); I-Yin Li, Miao-Li County (TW); Chia-Chi Ho, Miao-Li County (TW); Hsu-Kuan Hsu, Miao-Li County (TW); Ker-Yih Kao, Miao-Li County (TW); Chung-Kuang Wei, Miao-Li County (TW); Chin-Lung Ting, Miao-Li County (TW); Cheng-Chi Wang, Miao-Li County (TW); Chien-Hsing Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 417 days.

(21) Appl. No.: 15/657,345

(22) Filed: Jul. 24, 2017

(65) Prior Publication Data

US 2018/0026374 A1     Jan. 25, 2018

(30) Foreign Application Priority Data

Jul. 25, 2016  (CN) .......................... 2016 1 0587588
Oct. 31, 2016  (CN) .......................... 2016 1 0933160

(51) Int. Cl.
*H01Q 9/06* (2006.01)
*H01Q 1/38* (2006.01)
*H01Q 9/04* (2006.01)
*G06F 1/16* (2006.01)
*H01L 21/762* (2006.01)
*H04B 7/155* (2006.01)

(52) U.S. Cl.
CPC ............... *H01Q 9/065* (2013.01); *G06F 1/16* (2013.01); *H01Q 1/38* (2013.01); *H01Q 9/045* (2013.01); *H01L 21/762* (2013.01); *H01Q 9/0421* (2013.01); *H04B 7/15578* (2013.01)

(58) Field of Classification Search
CPC ......... H01Q 9/065; H01Q 9/0414; H01Q 3/44
See application file for complete search history.

(56) References Cited

U.S. PATENT DOCUMENTS

| | | | | |
|---|---|---|---|---|
| 5,592,314 A | * | 1/1997 | Ogasawara | .......... G02F 1/13473 349/114 |
| 6,545,739 B1 | * | 4/2003 | Matsumoto | ........ G02B 6/29358 349/198 |
| 6,552,696 B1 | * | 4/2003 | Sievenpiper | ............. H01Q 3/44 343/700 MS |
| 9,780,451 B2 | * | 10/2017 | Stevenson | ............. H01P 11/008 |

(Continued)

*Primary Examiner* — Dameon E Levi
*Assistant Examiner* — Jennifer F Hu
(74) *Attorney, Agent, or Firm* — McClure, Qualey & Rodack, LLP

(57) ABSTRACT

An antenna device includes a first dielectric substrate, a first radiator disposed on the first dielectric substrate, a second dielectric substrate disposed on the first radiator, a second radiator disposed between the first dielectric substrate and the second dielectric substrate, a main radiator, disposed on the second dielectric substrate, and a modulation structure located between a first radiation portion of the first radiator and a second radiation portion of the second radiator. The first radiation portion, the modulation structure, and the second radiation portion are located in a central area.

20 Claims, 20 Drawing Sheets

(56) References Cited

U.S. PATENT DOCUMENTS

| | | | | |
|---|---|---|---|---|
| 9,843,103 B2* | 12/2017 | Bowers | ................... | H01Q 3/24 |
| 10,128,571 B2* | 11/2018 | Sazegar | .............. | G02F 1/13306 |
| 10,249,949 B2* | 4/2019 | Li | ............................ | H01Q 9/27 |
| 10,305,181 B2* | 5/2019 | Hong | ....................... | H01Q 3/00 |
| 2014/0098316 A1* | 4/2014 | You | ....................... | G02F 1/1334 |
| | | | | 349/42 |
| 2016/0241217 A1* | 8/2016 | Sazegar | .............. | G02F 1/13306 |

* cited by examiner

ANTENNA DEVICE

CROSS-REFERENCE TO RELATED APPLICATIONS

This Application claims priority of Republic of China Patent Applications No. 201610933160.0 filed on Oct. 31, 2016 and No. 201610587588.4 filed on Jul. 25, 2016, the entirety of which is incorporated by reference herein.

BACKGROUND

Field of the Invention

The present disclosure relates to an antenna device.

Description of the Related Art

Antenna device are used to radiate and/or receive typically electromagnetic signals, preferably with antenna gain, directivity, and efficiency. Antenna device includes an antenna array, and the antenna array includes a plurality of antenna units. The modulation structure of the antenna units comprises liquid-crystal units could be defined as liquid-crystal antenna units. In liquid-crystal antenna units, the rotation of the liquid-crystal units can be controlled by an electric field, and thus the dielectric constants of the liquid-crystal antenna units can be changed according to the characteristics of the double dielectric constants of the liquid-crystal units.

The arrangements of the liquid-crystal units of each of the liquid-crystal antenna units are controlled by electrical signals so as to change the dielectric constant of each of the liquid-crystal antenna units. The wave propagation direction of the antenna device will be changed.

By controlling the radiation directions of antenna array, the strongest microwave signals can be searched. The receiving or radiation directions can be adjusted according to the signal source, and thus the communication quality is enhanced. The signal source can be a satellite in space, a base station on the ground, or others.

Wireless communication via an antenna device can be used in many different kinds of vehicle, such as airplanes, yachts, ships, trains, cars, and motorcycles, or applied on internet of things, autopilots, or unmanned vehicles. Liquid-crystal antenna device has many advantages over conventional mechanical antenna device, such as being flat, light, and thin, and having a fast response time, not limited thereto.

Although existing antenna device has been generally adequate for their intended purposes, they have not been entirely satisfactory in all respects. Consequently, it would be desirable to provide a solution for improving antenna device.

BRIEF SUMMARY

The present disclosure provides an antenna device, which allows a wire easily connecting to a radiator, and thus the manufacture of the antenna device is simplified.

The present disclosure provides an antenna device, includes a first dielectric substrate, a first radiator, a second dielectric substrate, a second radiator, a main radiator, and a modulation structure. The first radiator is disposed on the first dielectric substrate. The first radiator includes a first radiation portion and a first connection portion disposed on the first dielectric substrate. The first connection portion is connected to the first radiation portion.

The second dielectric substrate is disposed on the first dielectric substrate. The second radiator is disposed between the first dielectric substrate and the second dielectric substrate, and the second radiator is disposed at one side of the second dielectric substrate. The second radiator includes a second radiation portion and a second connection portion connected to the second radiation portion. The main radiator is disposed an opposite side of the second dielectric substrate. The modulation structure is located between the first radiation portion and the second radiation portion.

The antenna device includes a central area, a first area and a second area. The first radiation portion, the modulation structure, and the second radiation portion are located in the central area. The first area connected to a side of the central area, and the second area connected to another side of the central area. The first connection portion is located in the first area, and the second connection portion is located in the second area In conclusion, the antenna device of the present disclosure utilizes the dislocation of the dielectric substrates located at two opposite sides of the modulation structure to allow the wire to be easily connected to the radiator. Therefore, the difficulty of manufacturing the antenna device is reduced.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1A:
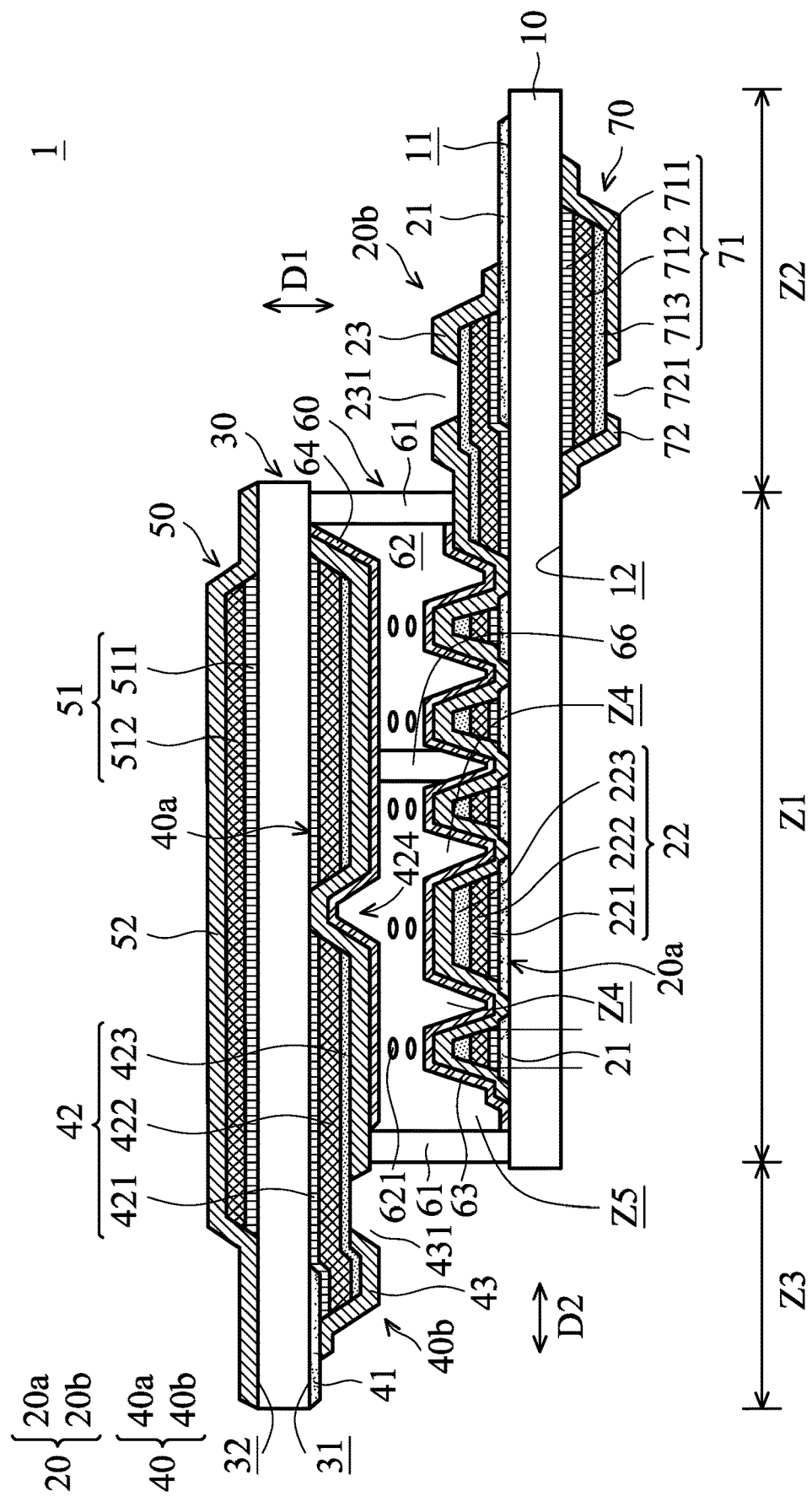
FIG. 1A is a schematic view of an antenna unit in accordance with a first embodiment of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

The words, such as "first" or "second", in the specification are for the purpose of clarity of description only, and are not relative to the claims or meant to limit the scope of the claims. In addition, terms such as "first feature" and "second feature" do not indicate the same or different features.

Spatially relative terms, such as upper and lower, may be used herein for ease of description to describe one element or feature's relationship to another element(s) or feature(s) as illustrated in the figures. The spatially relative terms are intended to encompass different orientations of the device in use or operation in addition to the orientation depicted in the figures.

The shape, size, and thickness in the drawings may not be drawn to scale or simplified for clarity of discussion; rather, these drawings are merely intended for illustration.

Figure 1B:
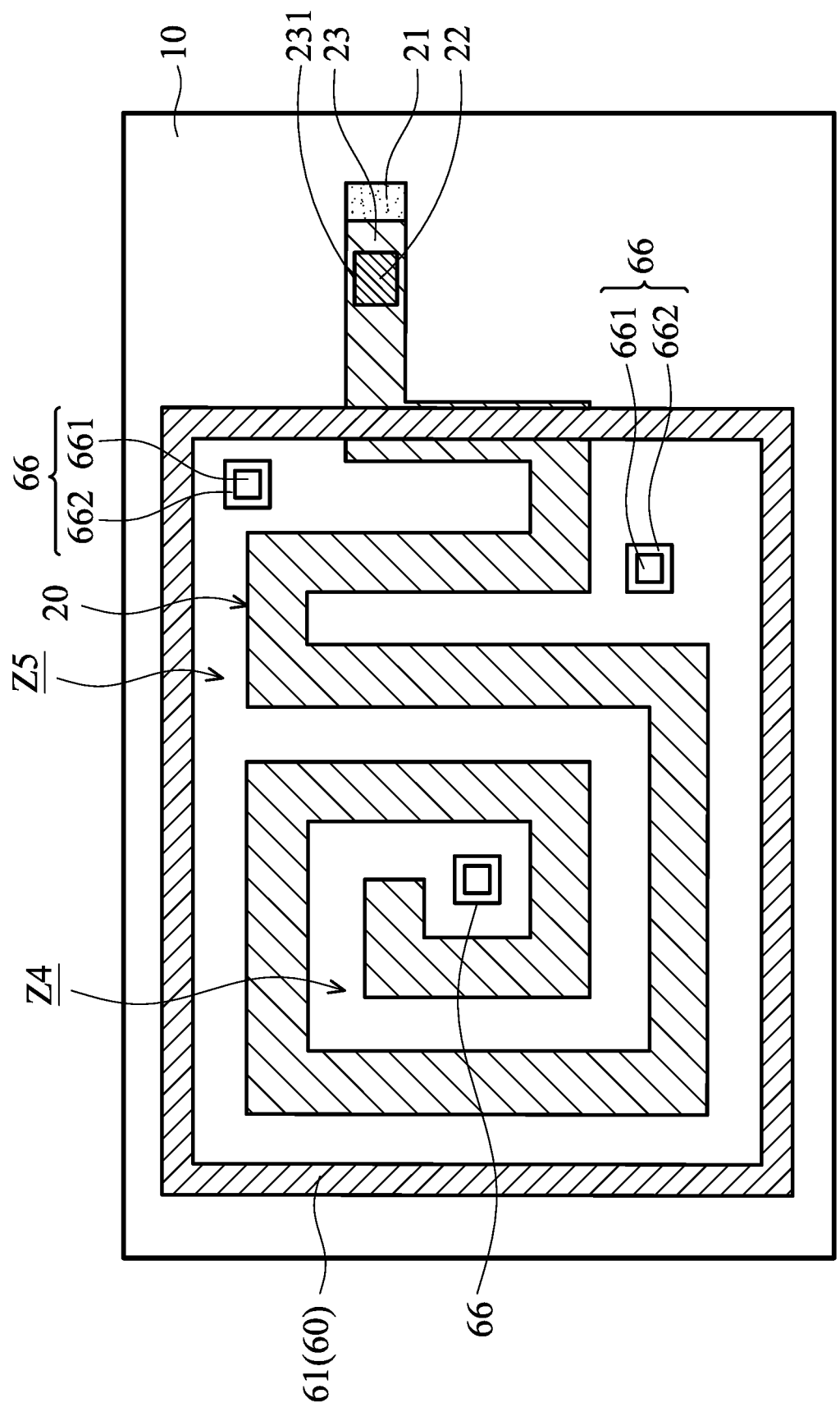
FIG. 1B is a schematic top view of a first radiator in accordance with a first embodiment of the present disclosure.

The Antenna device of the present disclosure includes an antenna array, and the antenna array includes a number of antenna units. FIG. 1A is a schematic view of an antenna unit 1 in accordance with a first embodiment of the present disclosure. FIG. 1B is a schematic top view of a first radiator 20 in accordance with the first embodiment of the present disclosure. The antenna unit 1 includes a first radiation assembly (10, 20 and 70), a second radiation assembly (30, 40, 50), and a modulation structure 60. The modulation structure 60 is located between the first radiation assembly and the second radiation assembly.

The first radiation assembly (10, 20 and 70) includes a first dielectric substrate 10, a first radiator 20, and a third radiator 70. The first radiator 20 includes a feeding area 231, and third radiator 70 includes a feeding area 721. The second radiation assembly (30, 40 and 50) includes a second dielectric substrate 30, a second radiator 40, and a main radiator 50. The second radiator 40 includes a feeding area 424, and a feeding area 431. In this embodiment, the first dielectric substrate 10, the first radiator 20, the second dielectric substrate 30, the second radiator 40, the main radiator 50, and third radiator 70 are extended along an extension direction D2.

The first dielectric substrate 10 can be a plate structure. The material of the first dielectric substrate 10 can be glass or polyimide, and the first dielectric substrate 10 can have rigidity or flexible characteristic.

The first radiator 20 is disposed on the first dielectric substrate 10, and extends along the first dielectric substrate 10. As shown in FIG. 1B, the first radiator 20 forms a transmission part on the first dielectric substrate 10. The first radiator 20 includes a first radiation portion 20a and a first connection portion 20b. The first radiation portion 20a and the first connection portion 20b are disposed on an upper surface 11 of the first dielectric substrate 10. The first connection portion 20b is connected to the first radiation portion 20a, and it is configured to transmit or receive radiation signals and/or to be grounded. The first connection portion 20b is also configured to receive a first control signal.

The second dielectric substrate 30 is disposed on the first dielectric substrate 10, and separated from the first dielectric substrate 10. In this embodiment, the second dielectric substrate 30 is substantially parallel to the first dielectric substrate 10. The second dielectric substrate 30 and the first dielectric substrate 10 extend in extension direction D2, the extension direction D2 is perpendicular to a stacking direction D1, and the second dielectric substrate 30 and the first dielectric substrate 10 are displaced in the stacking direction D1. In this embodiment, the second dielectric substrate 30 is a plate structure, and the material of the second dielectric substrate 30 is glass or polyimide, and the first dielectric substrate 10 can have rigidity or flexible characteristic.

The second radiator 40 is disposed on the first radiator 20, and separated from the first radiator 20. The second radiator 40 is disposed on the second dielectric substrate 30, and extends along the second dielectric substrate 30. In other words, the second radiator 40 is disposed between the first dielectric substrate 10 and the second dielectric substrate 30. The second radiator 40 includes a second radiation portion 40a and a second connection portion 40b. The second radiation portion 40a and the second connection portion 40b are disposed on a lower surface 31 of the second dielectric substrate 30. The second connection portion 40b is connected to the second radiation portion 40a, and configured to transmit or receive the radiation signals and/or to be grounded. The second connection portion 40b is also configured to receive a second control signal.

The main radiator 50 is disposed on the second dielectric substrate 30, and extends along the second dielectric substrate 30. In other words, the main radiator 50 and the second radiator 40 are located at two opposite sides of the second dielectric substrate 30. The main radiator 50 is configured to emit main radiation signals.

The modulation structure 60 is located between the first radiation portion 20a and the second radiation portion 40a. The modulation structure 60 includes a seal wall 61, a modulation material 62, a first alignment layer 63, a second alignment layer 64 and spacing elements 66. The seal wall 61 could be a ring structure. The seal wall 61 is connected to the first radiation portion 20a and the second radiation portion 40a. The modulation material 62 is filled into a space surrounded by the seal wall 61. In some embodiments, the modulation material 62 could include liquid-crystal units 621.

The first alignment layer 63 is disposed on the first radiator 20, and the second alignment layer 64 is disposed on the second radiator 40. The first alignment layer 63 and the second alignment layer 64 are configured to adjust the arrangement of the liquid-crystal units 621.

In some embodiments, the first alignment layer 63 and the second alignment layer 64 are formed by the alignment material. Alignment-film-printing is utilized to print the alignment material to the first radiator 20, the first dielectric substrate 10, the second radiator 40, and the second dielectric substrate 30 by contact printing, or in-jet printing.

In some embodiments, the first alignment layer 63 is formed by spraying the alignment material to the first radiator 20 and the first dielectric substrate 10. The second alignment layer 64 is formed by spraying the alignment material spraying to the second radiator 40 and the second dielectric substrate 30. In some embodiments, the first alignment layer 63 may not directly formed on the first dielectric substrate 10, and the second alignment layer 64 may not directly formed on the second dielectric substrate 30.

In some embodiments, the alignment material carries electric charges, and the alignment material with electric charges adheres to the first radiator 20 and/or the second radiator 40. In some embodiments, the alignment material with electric charges adheres to the first dielectric substrate 10 and/or the second dielectric substrate 30.

In some embodiments, when the modulation material 62 includes liquid-crystal units 621, alignment units are incorporated into the modulation material 62. The alignment units are gathered on the alignment layer to generate a pre-tilt angle by irradiating ultraviolet light and applying voltage. Therefore, the misalignment of the liquid-crystal units 621 in the conventional art due to the level difference of the alignment material generated by using plush fabrics to rub against the first alignment layer 63 or the second alignment layer 64 in the conventional art is reduced.

In some embodiments, the first alignment layer 63 or the second alignment layer 64 are incorporated with alignment units. A pre-tilt angle is generated on the alignment layer by optical alignment technology. Therefore, misalignment of the liquid-crystal units 621 in the conventional art due to the level difference of the alignment material generated by using plush fabrics to rub against the first alignment layer 63 or the second alignment layer 64 is reduced.

In this embodiment, a portion of the first dielectric substrate 10, the first radiation portion 20a, the modulation structure 60, the second radiation portion 40a, a portion of the second dielectric substrate 30, and a portion of the main radiator 50 are located in a central area Z1. In the central area Z1, the first dielectric substrate 10, the first radiation portion 20a, the modulation structure 60, the second radiation portion 40a, the second dielectric substrate 30, and the main radiator 50 are substantially stacked along the stacking direction D1 in sequence.

A first area Z2 extends from a side of the central area Z1, and a second area Z3 extends from another side of the central area Z1. The first connection portion 20b and third radiator 70 are located in first area Z2. A portion of the main radiator 50 and the second connection portion 40b are located in the second area Z3.

In this embodiment, the first area Z2 extends from the central area Z1 along the extension direction D2, and the second area Z3 extends from the central area Z1 along the extension direction D2. The extension direction D2 is substantially perpendicular to the stacking direction D1. In some embodiments, the first area Z2 and the second area Z3 are located at different sides or two opposite sides of the central area Z1. In this embodiment, the first area Z2 and the second area Z3 are located at two opposite sides of the central area Z1.

As shown in FIG. 1A, in the first area Z2, the second dielectric substrate 30, the second radiator 40 and the main radiator 50 are not located over the first dielectric substrate 10 in the stacking direction D1. Moreover, in the second area Z3, the first dielectric substrate 10, the first radiator 20 and third radiator 70 are not located under the second dielectric substrate 30 in the stacking direction D1. In other words, the first radiator 20 is displaced with the second radiator 40 in the stacking direction D1. The first dielectric substrate 10 is substantially displaced with the second dielectric substrate 30 in the stacking direction D1.

The third radiator 70 is disposed on the first dielectric substrate 10, and extends along the first dielectric substrate 10. In other words, third radiator 70 and the first radiator 20 are located at two opposite sides (or different sides) of the first dielectric substrate 10.

In this embodiment, the third radiator 70 is located in the first area Z2. The third radiator 70 and the first connection portion 20b are located at two opposite sides of the first dielectric substrate 10. The third radiator 70, the first dielectric substrate 10, and the first connection portion 20b are stacked along the stacking direction D1 in sequence.

In this embodiment, the third radiator 70 and the first radiation portion 20a are configured to receive radiation signals, and transmit radiation signals via the first dielectric substrate 10. Moreover, by a transmission path formed by the first radiation portion 20a and the second radiation portion 40a, the radiation signals are transmitted in the modulation structure 60. Finally, the radiation signals are fed into the main radiator 50 via the feeding area 424, and are emitted by an antenna device.

In some embodiments, the antenna unit 1 does not include the third radiator 70. The first radiator 20 is configured to receive radiation signals, and the second radiator 40 is grounded. By the first radiator 20 coupling with the second radiator 40, the radiation signals are transmitted in the modulation structure 60. Finally, the radiation signals are emitted by the main radiator 50.

In the disclosed embodiments, the first radiator 20 is also configured to receive a first control signal, and the second radiator 40 is configured to receive a second control signal. By the first control signals and the second control signals, an electric field is generated between the first radiator 20 and the second radiator 40. The phase of the modulation structure 60 is changed by the electric field so that the wave propagation direction of the antenna array can be changed. For example, when the modulation structure includes liquid-crystal units 621, the angles of inclinations of the liquid-crystal units 621 of the modulation structure 60 are changed by the electric field. By the change of the angles of inclinations of the liquid-crystal units 621, the propagation speed of the signals transmitted by the antenna array can be changed.

As shown in FIG. 1A and FIG. 1B, the first radiator 20 includes a first conductive control layer 21, a first conductive signal layer 22, and a first protective layer 23. The first conductive control layer 21 is disposed on the upper surface 11 of the first dielectric substrate 10. In this embodiment, the first conductive control layer 21 is located in the central area Z1 and the first area Z2.

In this embodiment, in the first area Z2, one end of the first conductive control layer 21 is not covered by the first conductive signal layer 22 and the first protective layer 23. Therefore, a wire can be connected to the end of the first conductive control layer 21, and the first conductive control layer 21 can receive the first control signals via the wire.

The first conductive control layer 21 includes metal, metal oxide, metal nitride, metal nitrogen-oxide, or conductive polymer. The conductive polymer includes total organic carbon (TOC) material, such as ITO, IZO, or IGZO.

The first conductive signal layer 22 is disposed on the first conductive control layer 21, and is connected to the first conductive control layer 21. In other words, the first conductive signal layer 22 is disposed on the first dielectric substrate 10. The first conductive signal layer 22 is located in the central area Z1 and the first area Z2. The first conductive signal layer 22 located in the first area Z2 is configured to transmit or receive radiation signals, or be grounded.

The first conductive signal layer 22 could include conductive layers 221, 222 and 223. The conductive layer 221 is disposed on the first conductive control layer 21, the conductive layer 222 is disposed on the conductive layer 221, and the conductive layer 223 is disposed on conductive layer 222.

In some embodiments, the material of the conductive layer 221 can be Mo, configured to increase the adhesion between the first conductive signal layer 22 and the first dielectric substrate 10. The material of the conductive layer 222 can be Cu or Au, which has a low resistance for improving the transmission of radiation signals. The material of the conductive layer 223 can be IZO, ITO or Au, configured to increase the corrosion resistance of the first conductive signal layer 22 and protect the first conductive signal layer 22. The conductive layers 221, 222 and 223 can be made by sputtering, chemical plating, or plating. In chemical plating, a seed layer, such as Mo, Au and Cu is deposited first.

The resistance of the conductive signal layer 22 is reduced by formation of the conductive layers 221, 222 and 223. The thickness of each of the conductive layers 221 and 223 is less than or equal to 1 um. The thickness of the conductive layer 222 is in a range of about 0.5 um to 3 um. In general, when the thickness of the conductive layer 221, 222 or 223 is too thick (such as greater than 1 um), the first dielectric substrate 10 may be curved by the inner force of the conductive layer 221, 222 or 223. Therefore, the first dielectric substrate 10 may be broken or cannot be processed by exposure. Accordingly, for example, a conductive layer 221 having thickness of 0.3 um can be formed first. The inner force of the conductive layer 221 can be released after the conductive layer 221 is patterned and etched. Next, a conductive layer 222 having thickness in range from 0.5 um to 3 um can be formed, and then the conductive layer 222 is patterned and etched. As a result, the total thickness of stacking metal conductive layers can be at least 1 um or 3 um. Therefore, the requirement of the conductive signal layer 22 with a low resistance request is achieved.

In some embodiments, the first conductive signal layer 22 can be made of single material. The first conductive signal layer 22 may include Mo, Au, Ag, Cu, Al, Zn, Ni, or alloy. The alloy may be copper-nickel alloy, nickel-copper-titanium alloy, or IZO alloy. The first conductive signal layer 22 having single material can be made up of a number of layers.

In this embodiment, the equivalent resistance per unit length of the first conductive control layer 21 is greater than the equivalent resistance per unit length of the first conductive signal layer 22. Since the first conductive control layer 21 is located under the modulation structure 60 and under the first conductive signal layer 22. Therefore, when the modulation structure 60 includes liquid-crystal units 621, the control of the arrangement and the orientation of the liquid-crystal units 621 can be improved and can avoid the occurrence of marginal effects on the liquid-crystal unit 621. Moreover, the interference of the radiation signals generated by the first conductive signal layer 22 is reduced.

The first protective layer 23 is disposed on the first conductive signal layer 22, and is configured to protect the first conductive signal layer 22. The first protective layer 23 can be made of insulation material. In some embodiments, the first protective layer 23 may include $SiO_x$, $SiN_x$, or $SiO_xN_y$. The first protective layer 23 may be PFA (Polymer film on Array) or OC (over coat). The described materials are anti-scratch, anti-corrosion, or flattening. In some embodiments, the first protective layer 23 is not included.

As shown in FIGS. 1A and 1B, the first protective layer 23 includes a feeding area 231 that exposes a part of the first conductive signal layer 22. In some embodiments, the feeding area 231 is a hole. The feeding area 231 is located in the first area Z2. A wire may be connected to the first conductive signal layer 22 via the feeding area 231. Therefore, the first conductive signal layer 22 can transmit or receive the radiation signals, or be grounded via the feeding area 231.

As shown in FIG. 1A, the second radiator 40 includes a second conductive control layer 41, a second conductive signal layer 42, and a second protective layer 43. The second conductive control layer 41 is disposed on the lower surface 31 of the second dielectric substrate 30. In this embodiment, the second conductive control layer 41 is only located in the second area Z3.

In this embodiment, in the second area Z3, one end of the second conductive control layer 41 is not covered by the second conductive signal layer 42 and the second protective layer 43. Therefore, a wire can be connected to the end of the second conductive control layer 41, and the second conductive control layer 41 can receive the second control signal via the wire.

The second conductive control layer 41 includes metal, metal oxide, metal nitride, metal nitrogen-oxide, or conductive polymer. The conductive polymer includes total organic carbon (TOC) material, such as ITO, IZO, or IGZO.

The second conductive signal layer 42 is disposed on the second conductive control layer 41, and is connected to the second conductive control layer 41. In other words, the second conductive signal layer 42 is disposed on the second dielectric substrate 30. The second conductive signal layer 42 is located in the central area Z1 and the second area Z3. The second conductive signal layer 42 in the second area Z3 is configured to transmit or receive radiation signals, or be grounded.

The second conductive signal layer 42 includes conductive layers 421, 422 and 423. In the central area Z1, the conductive layer 421 is disposed on the lower surface 31 of the second dielectric substrate 30. In the second area Z3, the conductive layer 421 is disposed on the second conductive control layer 41. The conductive layer 422 is disposed on the conductive layer 421, and the conductive layer 423 is disposed on conductive layer 422. The materials, resistances, thicknesses and functions of conductive layers 421, 422 and 423 could be the same as or similar to those of conductive layers 221, 222 and 223. In some embodiments, the second conductive signal layer 42 can be made of single material.

In this embodiment, the equivalent resistance per unit length of the second conductive control layer 41 is greater than the equivalent resistance per unit length of the second conductive signal layer 42. The second protective layer 43 is disposed on the second conductive signal layer 42, and is configured to protect the second conductive signal layer 42. The second protective layer 43 can be made of insulation material. In some embodiments, the second protective layer 43 may include $SiO_x$, $SiN_x$, or $SiO_xN_y$. The second protective layer 43 may be PFA (Polymer film on Array) or OC (over coat). The described materials are anti-scratch, anti-corrosion, or flattening.

As shown in FIG. 1A, the second conductive signal layer 42 includes a feeding area 424. In some embodiments, the feeding area 424 is a hole. The feeding area 424 passes through the conductive layers 421, 422 and 423. Therefore, the radiation signals transmitted in the modulation structure 60 are coupled to the main radiator 50 via the feeding area 424.

The second protective layer 43 includes the feeding area 431 exposes a part of the second conductive signal layer 42. In some embodiments, the feeding area 431 is a hole. The feeding area 431 is located in the second area Z3. A wire is connected to the second conductive signal layer 42 via the feeding area 431. Therefore, the second conductive signal layer 42 can transmit or receive radiation signals, or be grounded via the feeding area 431.

As shown in FIG. 1A, the main radiator 50 includes a main conductive signal layer 51 and a main protective layer 52. The main conductive signal layer 51 is disposed on the upper surface 32 of the second dielectric substrate 30. The main conductive signal layer 51 is configured to emit main radiation signals.

The main conductive signal layer 51 includes conductive layers 511 and 512. The conductive layer 511 is disposed on the second dielectric substrate 30, and the conductive layer 512 is disposed on the conductive layer 511. The materials, resistances, thicknesses, and functions of conductive layers 511 and 512 could be the same as or similar to those of conductive layers 221 and 222. In some embodiments, the main conductive signal layer 51 is a conductive layer made of single material.

The main protective layer 52 is disposed on main conductive signal layer 51, and is configured to protect the main conductive signal layer 51. The main protective layer 52 can be made of insulation material. In some embodiments, the main protective layer 52 may include $SiO_X$, $SiN_X$, or $SiO_XN_y$. The main protective layer 52 may be PFA (Polymer film on Array) or OC (over coat). The described materials are anti-scratch, anti-corrosion, or flattening.

As shown in 1A, the third radiator 70 includes a third conductive signal layer 71 and a third protective layer 72. The third conductive signal layer 71 is disposed on the lower surface 12 of the first dielectric substrate 10. The third conductive signal layer 71 is configured to transmit radiation signals, or be grounded.

The third conductive signal layer 71 includes conductive layers 711, 712 and 713. The conductive layer 711 is disposed on the lower surface 12 of first dielectric substrate 10. The conductive layer 712 is disposed on the conductive layer 711, and the conductive layer 713 is disposed on the conductive layer 712. The materials, resistances, thicknesses, and functions of conductive layers 711, 712 and 713 could be the same as or similar to those of conductive layers 221, 222 and 223. In some embodiments, the third conductive signal layer 71 is a conductive layer made of single material.

In this embodiment, the third protective layer 72 is disposed on the third conductive signal layer 71, and is configured to protect the third conductive signal layer 71. The third protective layer 72 can be made of insulation material. In some embodiments, the third protective layer 72 may include $SiO_X$, $SiN_X$, or $SiO_XN_y$. The third protective layer 72 may be PFA (Polymer film on Array) or OC (over coat). The descript materials are anti-scratch, anti-corrosion, or flattening.

As shown in FIG. 1A, the third protective layer 72 includes a feeding area 721 that exposes a part of the third conductive signal layer 71. In some embodiments, the feeding area 721 is a hole. The feeding area 721 is located in the first area Z2. A wire is connected to the third conductive signal layer 71 via a feeding area 721. Therefore, the third conductive signal layer 71 can transmit or receive radiation signals, or be grounded via the feeding area 721.

By the displacement of the first radiator 20 and the second radiator 40 in the stacking direction D1, and the displacement of the first dielectric substrate 10 and the second dielectric substrate 30 in the stacking direction D1, a wire configured to receive external signals is easily connected to the first conductive control layer 21, the first conductive signal layer 22, the second conductive control layer 41, and the second conductive signal layer 42. Therefore, the difficulty of manufacturing the antenna device is reduced.

In the manufacturing method of the antenna unit 1, first, the first radiator 20 is formed on a surface of the first dielectric substrate 10. Second, the second radiator 40 is formed on a surface of the second dielectric substrate 30. Third, the modulation structure 60 is formed between the first radiator 20 and the second radiator 40. Finally, the main radiator 50 is formed on another surface of the second dielectric substrate 30, and the third radiator 70 is formed on another surface of the first dielectric substrate 10.

In another manufacturing method of the antenna unit 1, first, the first radiator 20 is formed on a surface of the first dielectric substrate 10. Second, the second radiator 40 is formed on a surface of the second dielectric substrate 30. Third, some elements, such as seal walls 61, are connected to the first dielectric substrate 10 and the second dielectric substrate 30. Fourth, the main radiator 50 is formed on another surface of the second dielectric substrate 30, and the third radiator 70 is formed on another surface of the first dielectric substrate 10. Finally, the modulation material 62, such as the liquid-crystal units 621, is filled in a space surrounded by the seal walls 61 by vacuum adsorption or capillary injection method.

In some embodiments, the first radiator 20 and/or the third radiator 70 are formed on opposite side of the first dielectric substrate 10 by silver or copper paste printing. In some embodiments, the second radiator 40 and/or the main radiator 50 are formed on opposite sides of the second dielectric substrate 30 by silver or copper paste printing.

In some embodiments, the first radiator 20 and/or the third radiator 70 are formed on a soft material or a rigid material. In some embodiments, the first radiator 20 and/or the third radiator 70 are formed on a soft material or a rigid material by silver or copper paste printing. The soft material may be a flexible circuit board, a copper foil, or a soft substrate, polyimide. The rigid material may be a glass. Next, the soft material or rigid material is attached to the first dielectric substrate 10.

In some embodiments, the second radiator 40 and/or the main radiator 50 are formed on a soft material or a rigid material. In some embodiments, the second radiator 40 and/or the main radiator 50 are formed on a soft material or a rigid material by silver or copper paste printing. Next, the soft material or rigid material is attached to the second dielectric substrate 30.

In some embodiments, the radiators at two opposite sides of the first dielectric substrate 10 or the second dielectric substrate 30 are connected by a soft conductive material or a paste-like conductive material, to make the electrical potential of the radiators equal.

As shown in FIGS. 1A and 1B, the spacing element 66 is located between the first dielectric substrate 10 and the second dielectric substrate 30, and it is configured to maintain the distance between the first dielectric substrate 10 and the second dielectric substrate 30. In this embodiment, the spacing elements 66 are connected to the first dielectric substrate 10 and the second dielectric substrate 30. The spacing elements 66 are post structures. The first radiator 20 further includes invalid areas Z4 and Z5. In this embodiment, the invalid areas Z4 and Z5 are not located on the first conductive control layer 21 (or the first conductive signal layer 22). In other words, the invalid area Z4 is located between two adjacent segments of the first conductive control layer 21 (or the first conductive signal layer 22), and the invalid area Z5 is located between the first conductive control layer 21 (or the first conductive signal layer 22) and the seal wall 61. The spacing elements 66 are located at the invalid areas Z4 or Z5 of the first radiator 20. In other words, in the stacking direction D1, the spacing element 66 is not disposed over the first conductive control layer 21 (or the first conductive signal layer 22).

In some embodiments, the spacing elements 66 are connected to the first dielectric substrate 10 and the second dielectric substrate 30 by electrostatic adhesion. In some embodiments, the spacing elements 66 are connected to the first dielectric substrate 10 and the second dielectric substrate 30 with paste.

Figure 8:
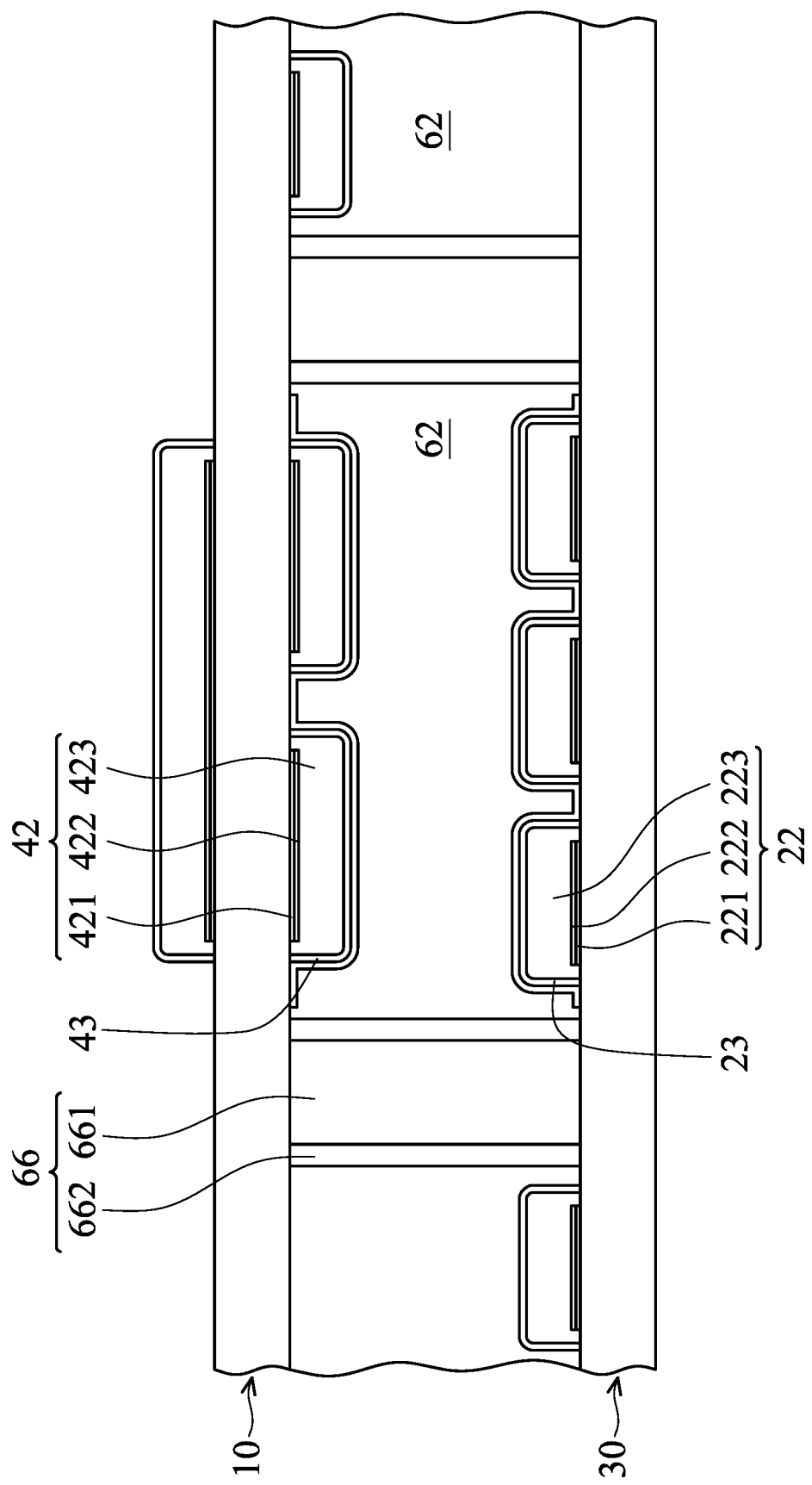
FIG. 8 is a schematic view of an antenna unit in accordance with an eighth embodiment of the present disclosure.

The spacing element 66 could include a spacing column 661 and a seal material 662 (as shown in FIGS. 1A, 1B and 8). The spacing column 661 is made of rigid material. The spacing column 661 is made of but not limited to single material or a composite layer of materials, such as Polyethylene Terephthalate (PET), Polyethylene (PE), Polyethersulfone (PES), Polycarbonate (PC), Polymethylmethacrylate (PMMA), or glass. In some embodiments, the spacing columns 661 are made by screen printing.

The seal material 662 covers the sides of the spacing column 661. In other words, the spacing column 661 is located within the seal material 662, and is configured to prevent the liquid-crystal units 621 from leaking.

Figure 2:
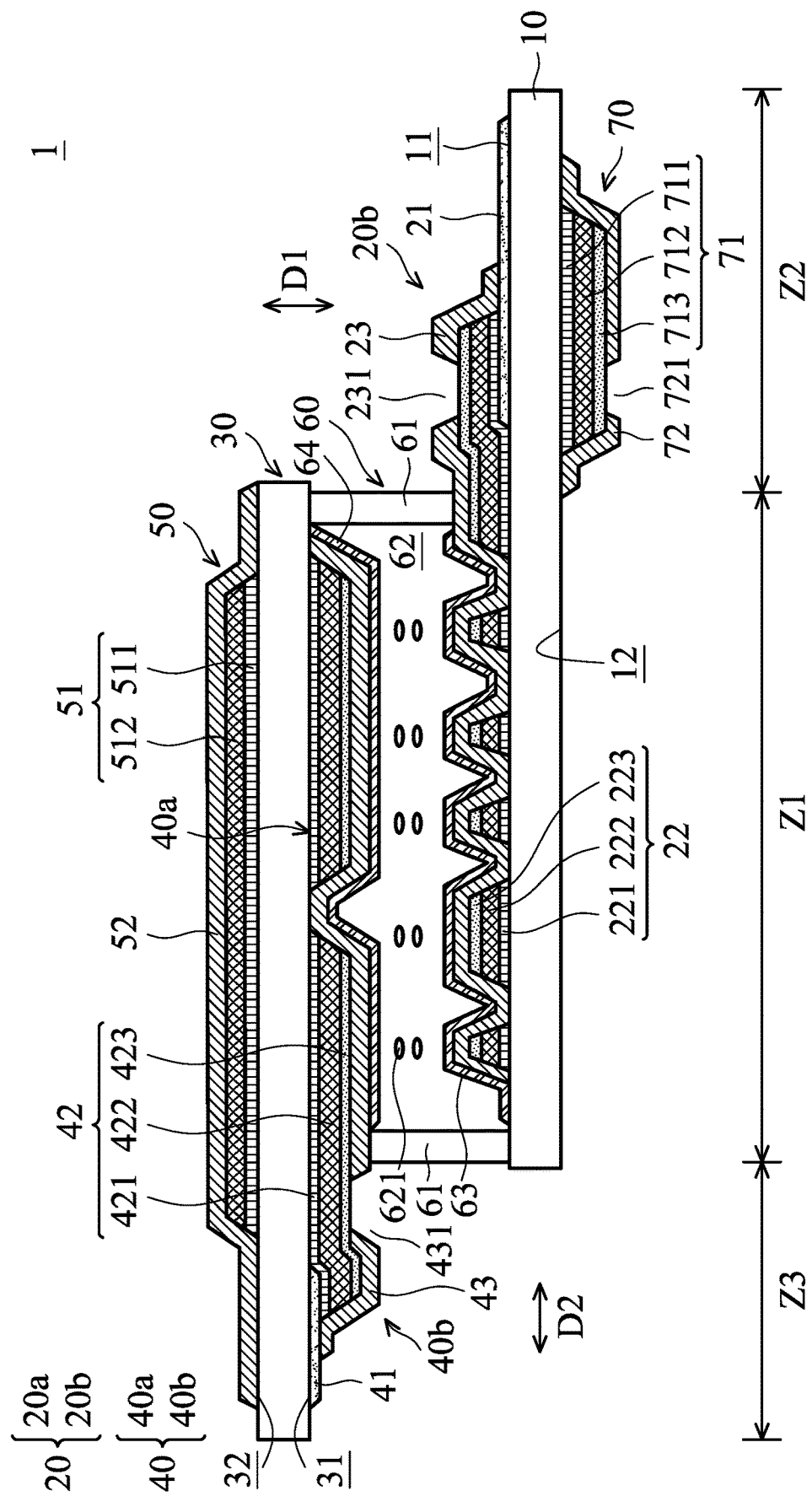
FIG. 2 is a schematic view of an antenna unit in accordance with a second embodiment of the present disclosure.

FIG. 2 is a schematic view of an antenna unit 1 in accordance with a second embodiment of the present disclosure. In the second embodiments, the first conductive control layer 21 is not disposed on the central area Z1. The first conductive control layer 21 is only disposed on the first area Z2. In the central area Z1, the conductive layer 221 is disposed on the first dielectric substrate 10. The first conductive control layer 21 is connected to the first conductive signal layer 22. The first control signal received by the first conductive control layer 21 is transmitted to the central area Z1 via the first conductive signal layer 22.

Figure 3:
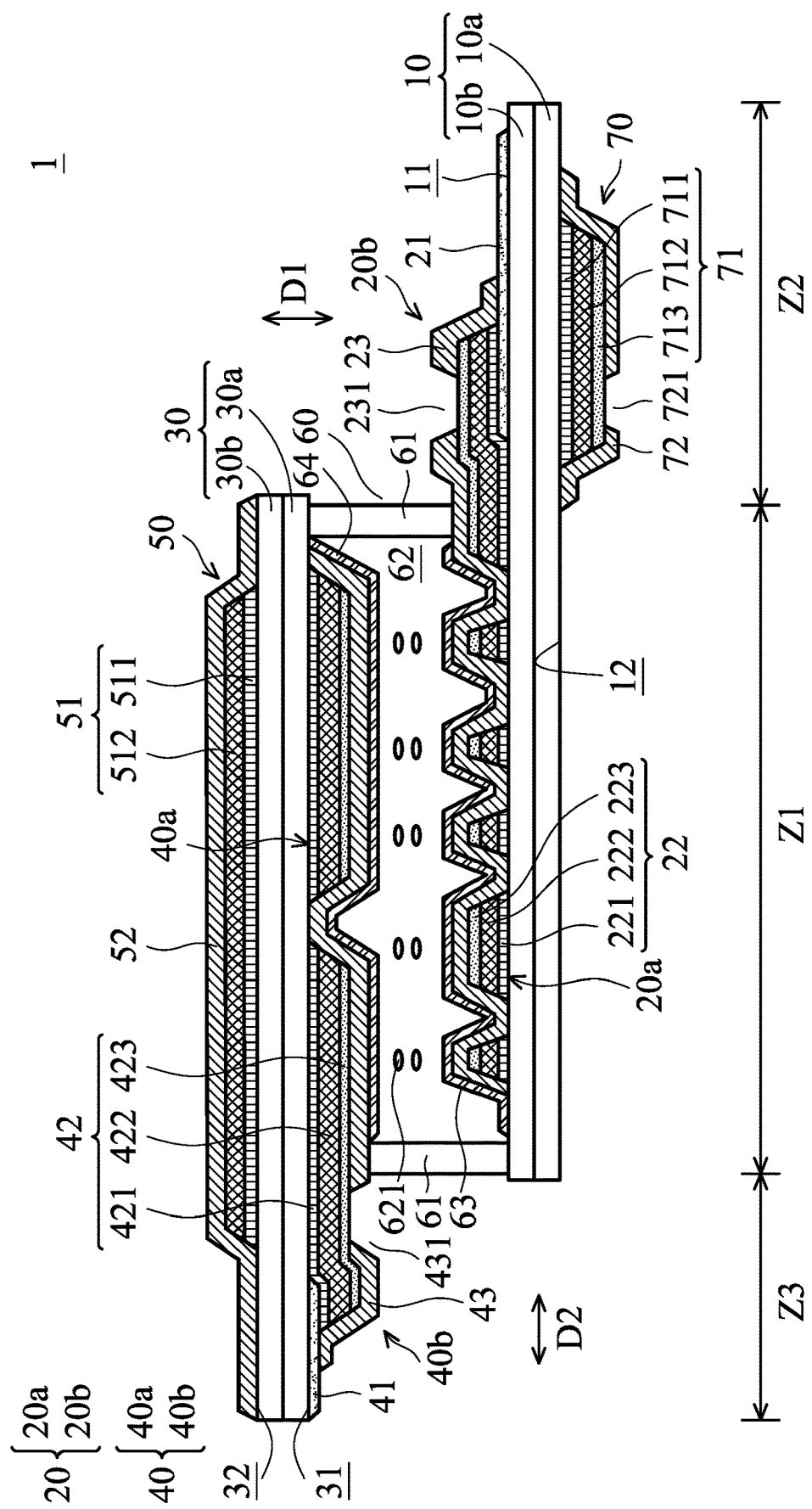
FIG. 3 is a schematic view of an antenna unit in accordance with a third embodiment of the present disclosure.

FIG. 3 is a schematic view of an antenna unit 1 in accordance with a third embodiment of the present disclosure. The first dielectric substrate 10 includes a first lower substrate 10a and a first upper substrate 10b. The first upper substrate 10b is disposed on and attached to the first lower substrate 10a. The first radiator 20 is disposed on first upper substrate 10b.

The second dielectric substrate 30 includes a second lower substrate 30a and a second upper substrate 30b. The second upper substrate 30b is disposed on and attached to the second lower substrate 30a. The second radiator 40 is disposed on the second lower substrate 30a, and the main radiator 50 is disposed on the second upper substrate 30b.

In this embodiment, first, the first radiator 20 is formed on the first upper substrate 10b, and the third radiator 70 is formed on the first lower substrate 10a. Next, the first upper substrate 10b is attached to the first lower substrate 10a. Moreover, the main radiator 50 was previously formed on the second upper substrate 30b, and the second radiator 40 is formed on the second lower substrate 30a. Next, the second upper substrate 30b is attached to the second lower substrate 30a. Therefore, the process of manufacturing the antenna unit 1 is simplified.

In some embodiments, the first radiator 20 has previously been formed on the first upper substrate 10b, and the second radiator 40 is formed on the second lower substrate 30a, the main radiator 50 is formed on second upper substrate 30b, and the third radiator 70 is formed on the first lower substrate 10a. Next, the modulation structure 60 is disposed between the first upper substrate 10b and the second lower substrate 30a. Finally, the first lower substrate 10a is attached to the first upper substrate 10b, and the second upper substrate 30b is attached to the second lower substrate 30a. Therefore, the process of manufacturing the antenna unit 1 is simplified.

Moreover, by stacking a thick first lower substrate 10a and a thick first upper substrate 10b, the thickness of the first dielectric substrate 10 is increased. By stacking a thick second lower substrate 30a and a thick second upper substrate 30b, the thickness of the second dielectric substrate 30 is increased.

Figure 4:
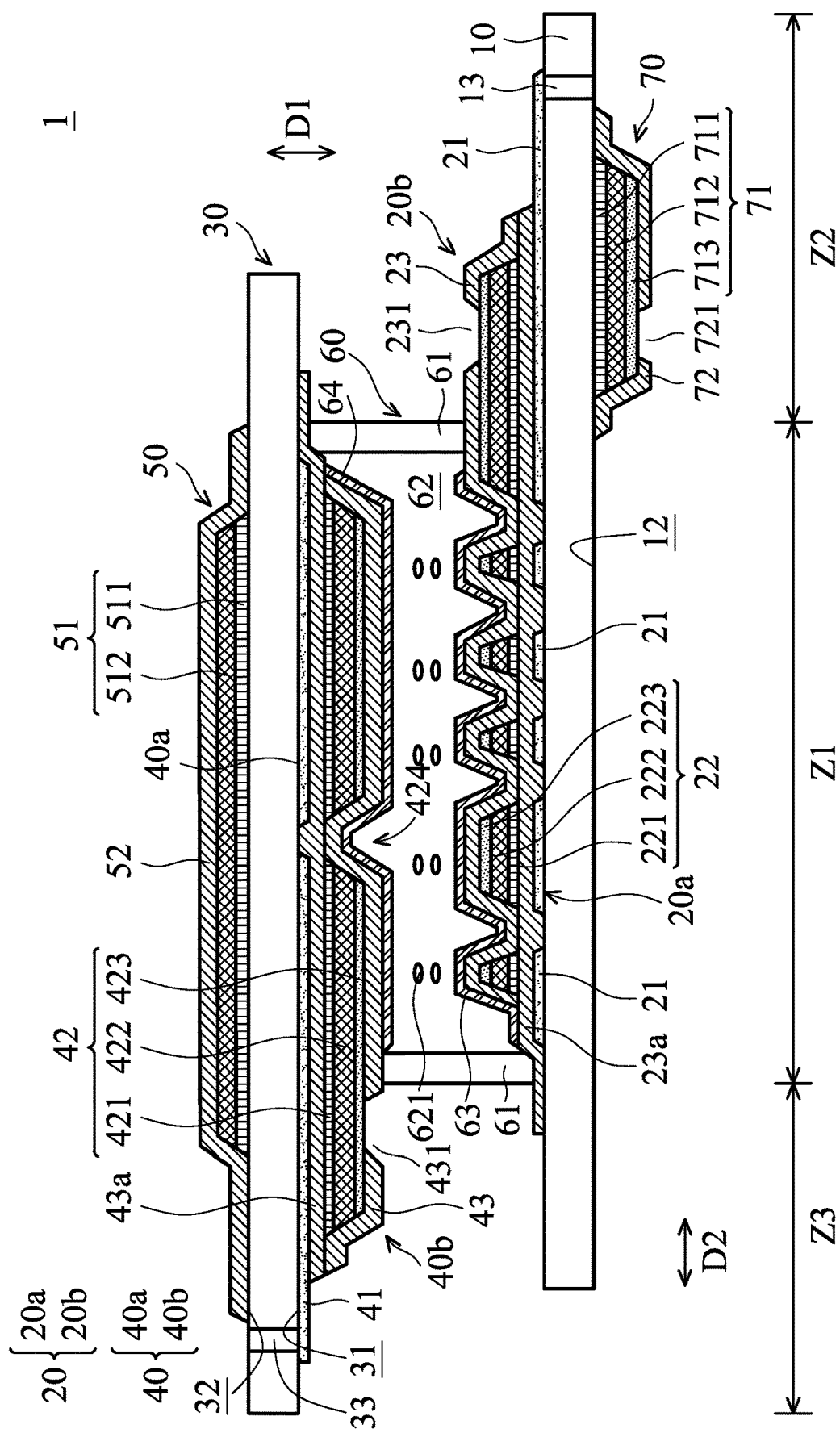
FIG. 4 is a schematic view of an antenna unit in accordance with a fourth embodiment of the present disclosure.

FIG. 4 is a schematic view of an antenna unit 1 in accordance with a fourth embodiment of the present disclosure. In the fourth embodiment, the first conductive control layer 21 is disposed on and in contact with the first dielectric substrate 10. The first conductive control layer 21 extends from the central area Z1 to the first area Z2. In another embodiment, the first conductive control layer 21 extends from the central area Z1 to the second area Z3.

The first radiator 20 further includes a first sub-protective layer 23a disposed on the first conductive control layer 21. Moreover, parts of the first sub-protective layer 23a passes through the first conductive control layer 21 to come into contact with the first dielectric substrate 10 in the invalid area Z4. The first conductive signal layer 22 is disposed on first sub-protective layer 23a, so as to isolate the first conductive signal layer 22 from the first conductive control layer 21. The first protective layer 23 is disposed on the first conductive signal layer 22, and it is configured to protect the first conductive signal layer 22. The first alignment layer 63 is disposed on the first protective layer 23.

The second conductive control layer 41 is disposed on and in contact with the second dielectric substrate 30. The second conductive control layer 41 extends from the central area Z1 to the second area Z3. In another embodiment, the second conductive control layer 41 extends from the central area Z1 to the first area Z2. The second sub-protective layer 43a is disposed on the second conductive control layer 41. Moreover, part of the second sub-protective layer 43a passes through the second conductive control layer 41 to come into contact with the second dielectric substrate 30 in the feeding area 424.

The second conductive signal layer 42 is disposed on the second sub-protective layer 43a, so as to isolate the second conductive signal layer 42 from the second conductive control layer 41. In other words, parts of the second sub-protective layer 43a are between the second conductive control layer 41 and the second conductive signal layer 42. The second protective layer 43 is disposed on the second conductive signal layer 42, and it is configured to protect the second conductive signal layer 42.

In this embodiment, the first conductive control layer 21 is not electrically connected to the first conductive signal layer 22. The second conductive control layer 41 is not electrically connected to the second conductive signal layer 42. Therefore, the interference between radiation signals and the control signal is reduced. The control accuracy, orientation stability, and modulation range of the modulation structure 60 is improved.

In this embodiment, the first dielectric substrate 10 could include a through hole 13. The through hole 13 is through the upper surface 11 and the lower surface 12, and extends along the stacking direction D1. A wire or a conductive material is connected to the first radiator 20 via the through hole 13. In this embodiment, a wire or a conductive material is connected to the first conductive control layer 21 via the through hole 13.

The second dielectric substrate 30 could include a through hole 33. The through hole 33 is through the upper surface 32 and the lower surface 31, and extends along the stacking direction D1. A wire or a conductive material is connected to the second radiator 40 via the through hole 33. In this embodiment, a wire or a conductive material is connected to the second conductive control layer 41 via the through hole 33.

The through hole 13 and the through hole 33 can be designed to any embodiments of the present disclosure.

Figure 5:
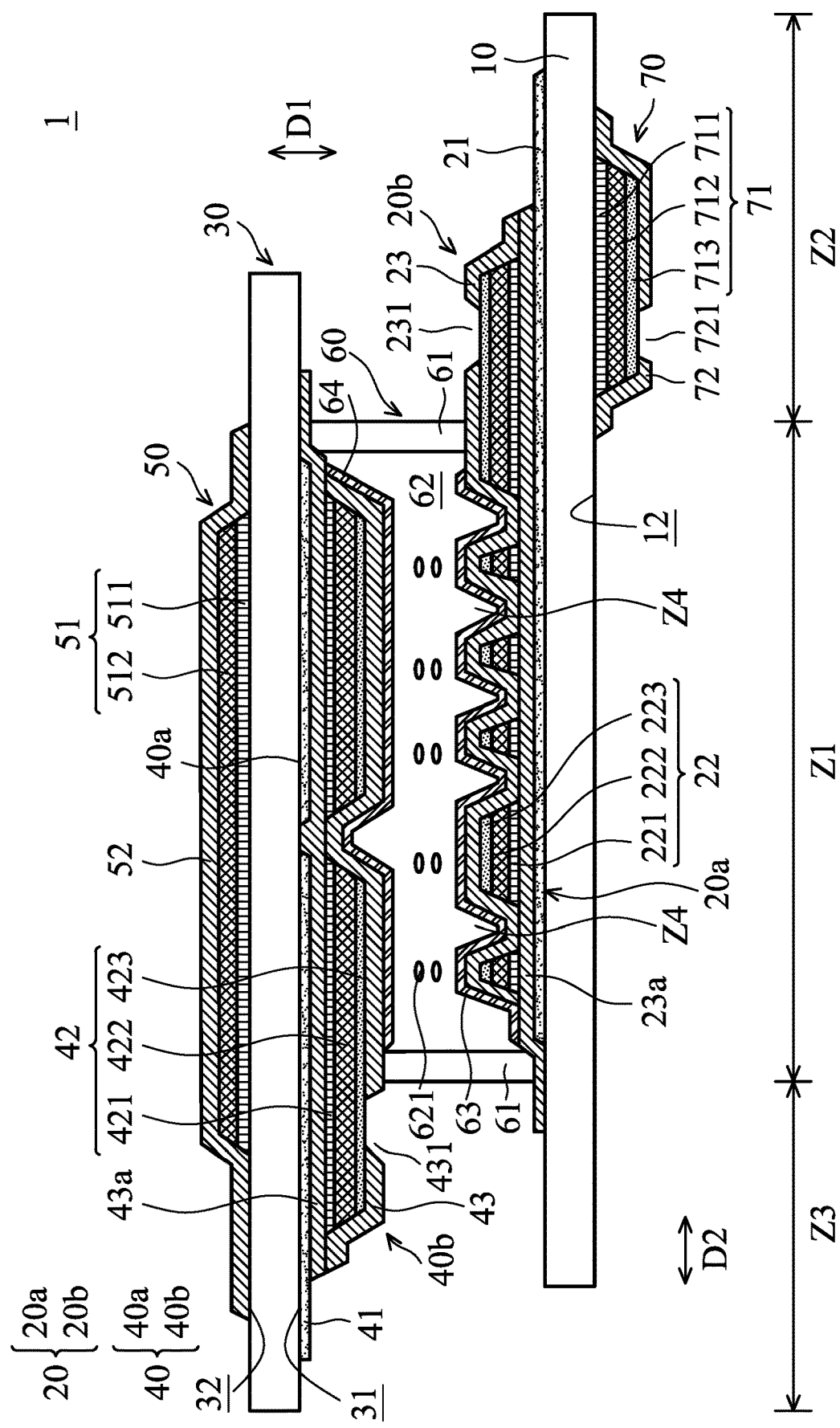
FIG. 5 is a schematic view of an antenna unit in accordance with a fifth embodiment of the present disclosure.

FIG. 5 is a schematic view of an antenna unit 1 in accordance with a fifth embodiment of the present disclosure. In the fifth embodiment, the first conductive control layer 21 is disposed on and in contact with the first dielectric substrate 10. The first conductive control layer 21 extends from the central area Z1 to the first area Z2. The first sub-protective layer 23*a* is disposed on the first conductive control layer 21. In this embodiment, the first sub-protective layer 23*a* does not pass through the first conductive control layer 21 in the invalid area Z4, and does not come into contact with the first dielectric substrate 10 in the invalid area Z4. The first conductive signal layer 22 is disposed on the first sub-protective layer 23*a*.

The second conductive control layer 41 is disposed on and in contact with the second dielectric substrate 30. The second conductive control layer 41 extends from the central area Z1 to the second area Z3. In another embodiment, the second conductive control layer 41 extends from the central area Z1 to the first area Z2. The second protective layer 43 is disposed on the second conductive control layer 41. The second sub-protective layer 43*a* is between the second conductive control layer 41 and the second conductive signal layer 42.

Figure 6:
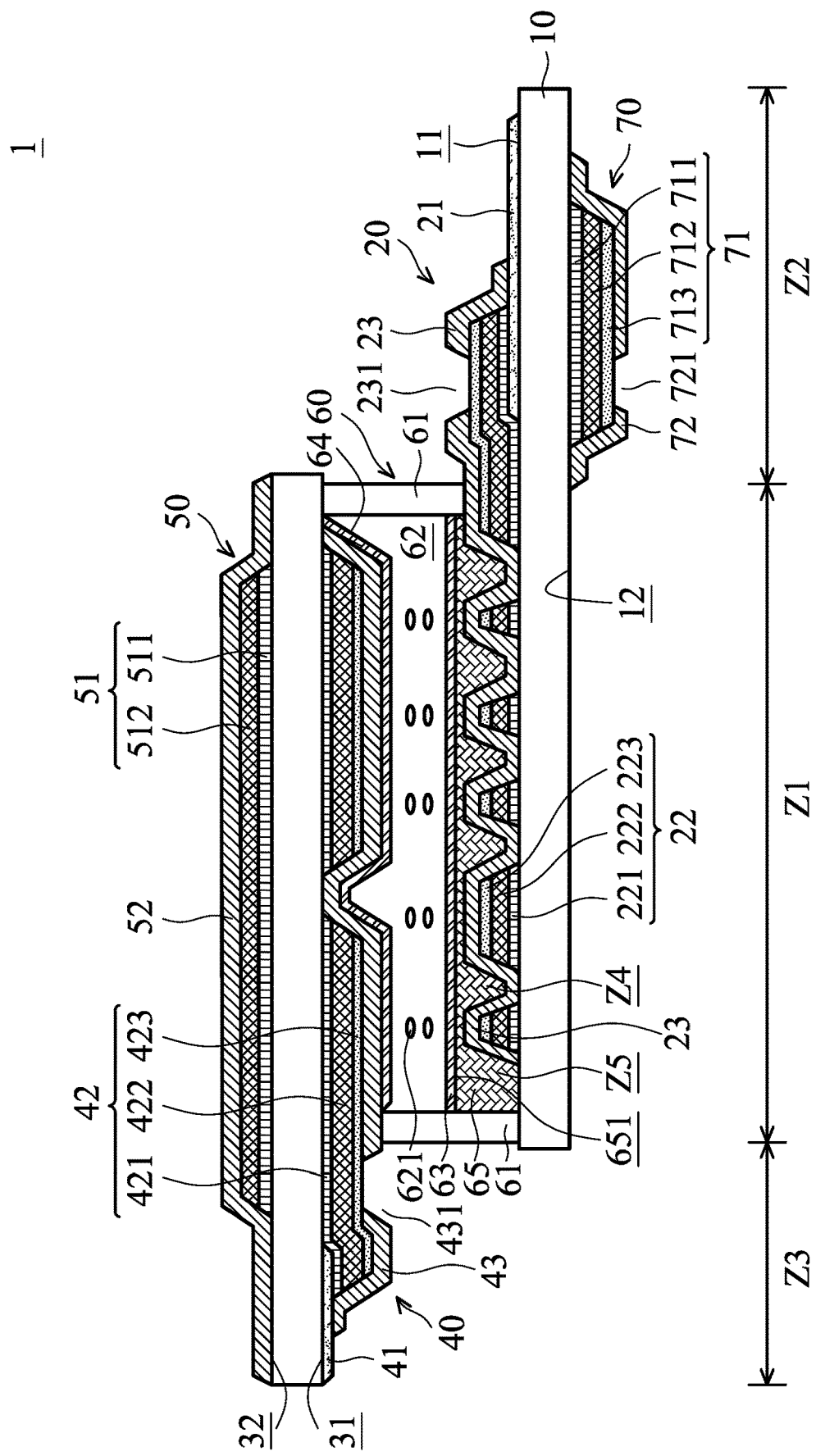
FIG. 6 is a schematic view of an antenna unit in accordance with a sixth embodiment of the present disclosure.

FIG. 6 is a schematic view of an antenna unit 1 in accordance with a sixth embodiment of the present disclosure. In some embodiments, the antenna unit 1 is a liquid-crystal antenna unit. The modulation structure 60 further includes a filling material 65 filled in a space surrounded by the seal walls 61, and covering the first radiator 20. The filling material 65 could be in contact with the first protective layer 23. The filling material 65 is filled with the invalid areas Z4, and the invalid areas Z5 between the first radiator 20 and the seal walls 61. The filling material 65 could form a flat upper surface 651. The first alignment layer 63 is disposed on the filling material 65. The modulation material 62 could be disposed between filling material 65 and the second radiator 40. In some embodiments, the modulation material 62 is a liquid-crystal material.

In this embodiment, the first alignment layer 63 extends along a plane, and it is substantially parallel to the first dielectric substrate 10. In some embodiments, a protective layer (passivation layer, not shown in figures) is located between the first alignment layer 63 and the filling material 65. In some embodiments, a protective layer is disposed on the filling material 65. In some embodiments, the filling material 65 is filled in the invalid areas Z4 and Z5. The filling material 65 is not filled over the conductive layer 223, and does not cover the conductive layer 223.

The filling material 65 is a single or composite organic material, such as glass paste, PET, Polyimide (PI), PES, PE, PC, or PMMA, but not limited to.

The invalid areas Z4 and Z5 slightly influence the radiation signals, and the material of the first dielectric substrate 10 can be glass, polyimide or plastic, and the material of the second dielectric substrate 30 can be glass, polyimide or plastic. Therefore, the quality of the radiation signals is not greatly decreased by replacing the modulation material 62 with the filling material 65 in the invalid areas Z4 and Z5. In this embodiment, the invalid areas Z4 and Z5 are filled with the filling material 65, but not the modulation material 62. Therefore, less modulation material 62 is used, and thus the manufacturing cost of the antenna unit 1 is decreased. In some embodiments, the filling material 65 is filled into the invalid areas Z4 and Z5. The filling material 65 is not filled over the conductive layer 223, and does not cover the conductive layer 223.

In some embodiments, first, the filling material 65 is disposed on the first dielectric substrate 10. Afterwards, parts of the filling material 65 are trenched to form channels, and then the first radiator 20 is disposed in the channels.

Figure 7:
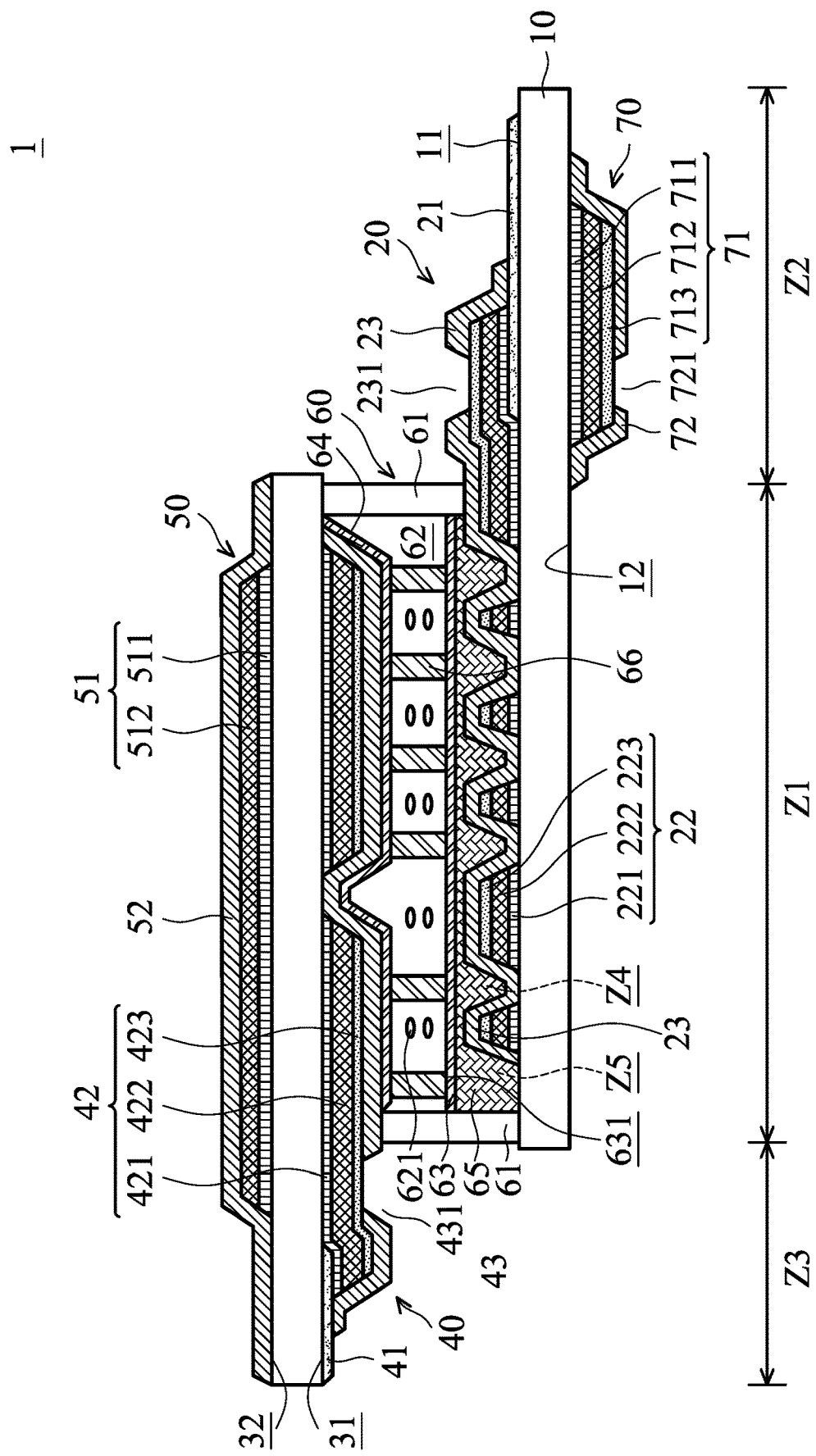
FIG. 7 is a schematic view of an antenna unit in accordance with a seventh embodiment of the present disclosure.

FIG. 7 is a schematic view of an antenna unit 1 in accordance with a seventh embodiment of the present disclosure. In some embodiments, the antenna unit 1 is a liquid-crystal antenna unit. The spacing elements 66 are disposed in a space surrounded by the seal walls 61. The spacing elements 66 are located between the filling material 65 and the second radiator 40. In some embodiments, the spacing elements 66 are connected to the first alignment layer 63 and the second alignment layer 64. When the number of spacing elements 66 disposed in the invalid areas Z4 and Z5 is high, and the amount of modulation material 62 used in the antenna unit 1 could be decreased. In some embodiments, the modulation material 62 is a liquid-crystal material.

In this embodiment, the spacing element 66 can be a plastic-like material or a plastic material. The plastic-like material can be a single or composite organic material, such as acrylic material, glass paste, PET, PI, PES, PE, PC, or PMMA, but not limited to. The spacing element 66 can be paste. After the spacing elements 66 are disposed in the invalid area Z4 or Z5, the spacing elements 66 form lumps.

FIG. 8 is a schematic view of an antenna unit 1 in accordance with an eighth embodiment of the present disclosure. In this embodiment, the conductive layer 221 is formed on the first dielectric substrate 10 by printing, chemical plating, sputtering, or evaporation. The conductive layer 222 is formed on the conductive layer 221 by chemical plating or plating. The conductive layer 223 is formed on the conductive layer 222 by chemical plating or plating. The conductive layers 221 and 222 can be seed layers. The material of the conductive layer 221 can be Mo, the material of the conductive layer 222 can be Cu, and the material of the conductive layer 223 can be Au, but not limited to.

Figure 9:
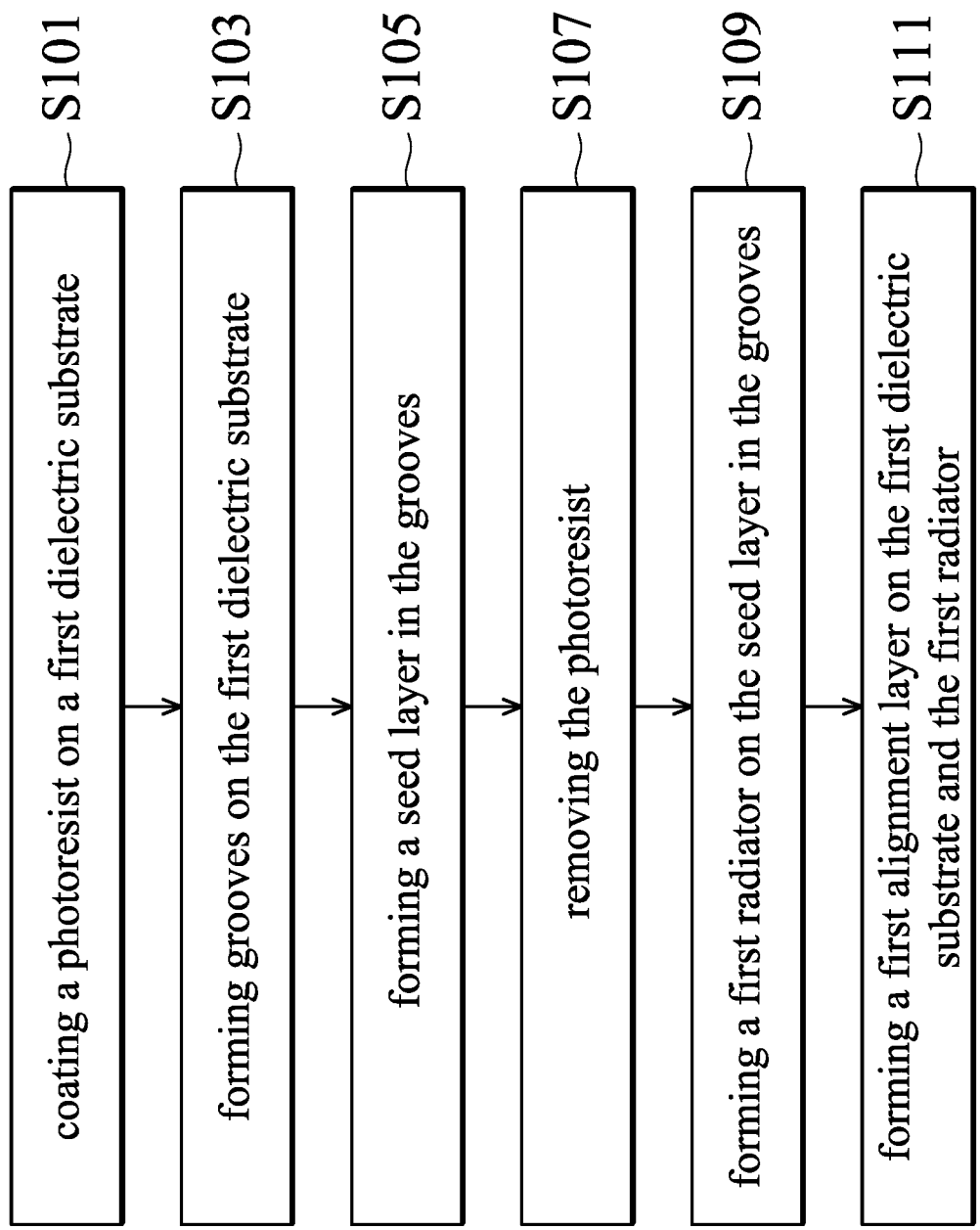
FIG. 9 is a flow chart of a manufacturing method of an antenna device in accordance with a ninth embodiment of the present disclosure.
Figure 10A:
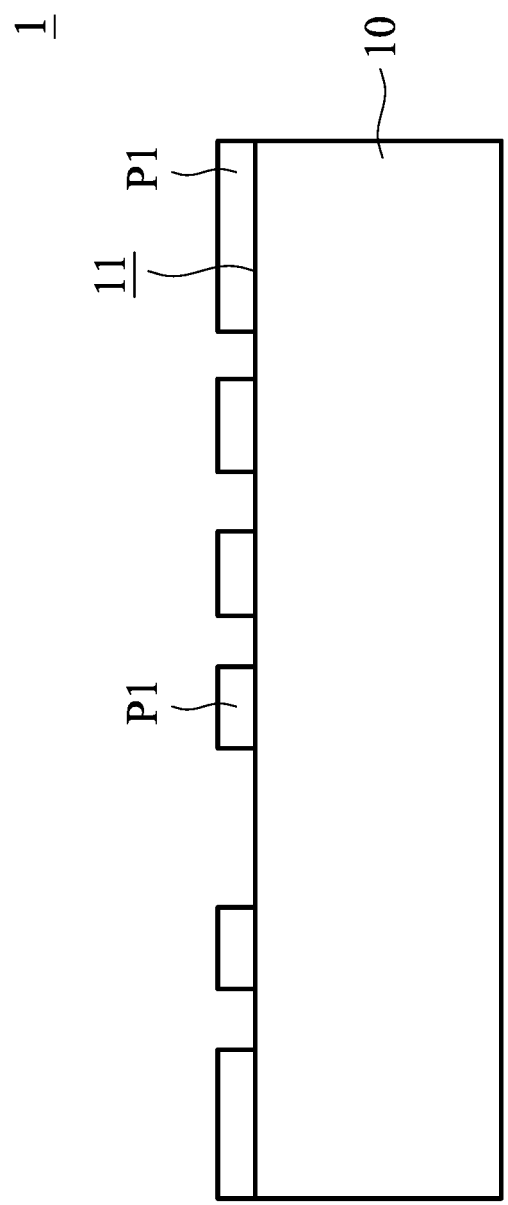
FIGS. 10A to 10F are schematic views of the manufacturing method of the antenna unit during intermediate stages.

FIG. 9 is a flow chart of a manufacturing method of an antenna device in accordance with a ninth embodiment of the present disclosure. FIGS. 10A to 10F are schematic views of the manufacturing method of the antenna unit 1 during intermediate stages. In step S101, as shown in FIG. 10A, the photoresist P1 is formed on the upper surface 11 of the first dielectric substrate 10, and the photoresist P1 forms a transmission part.

Figure 10B:
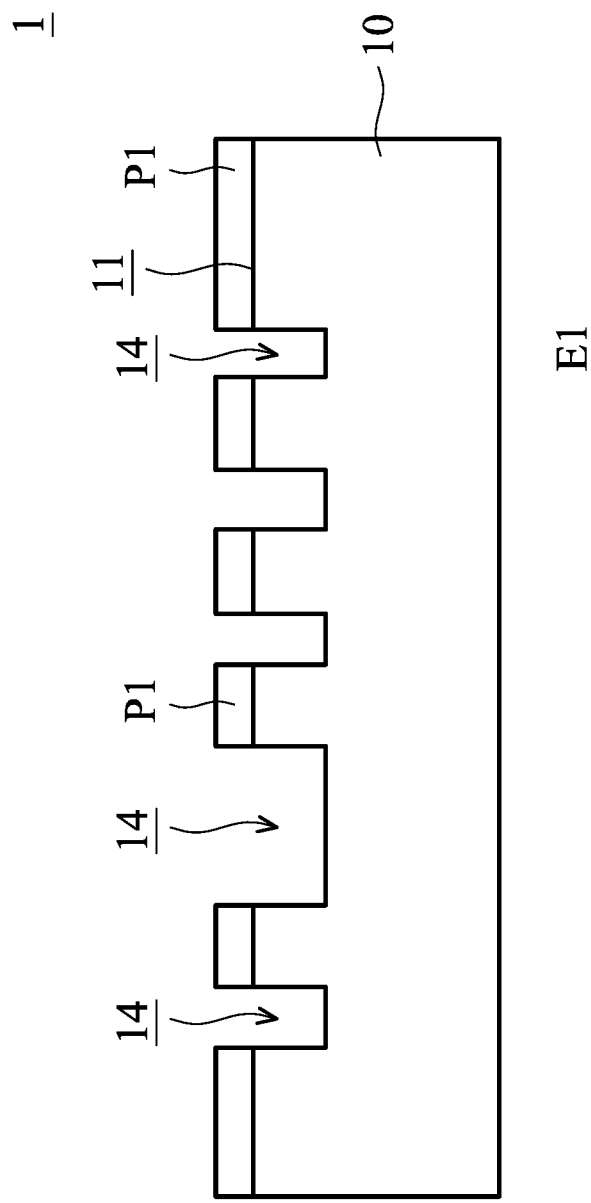
Figure 10C:
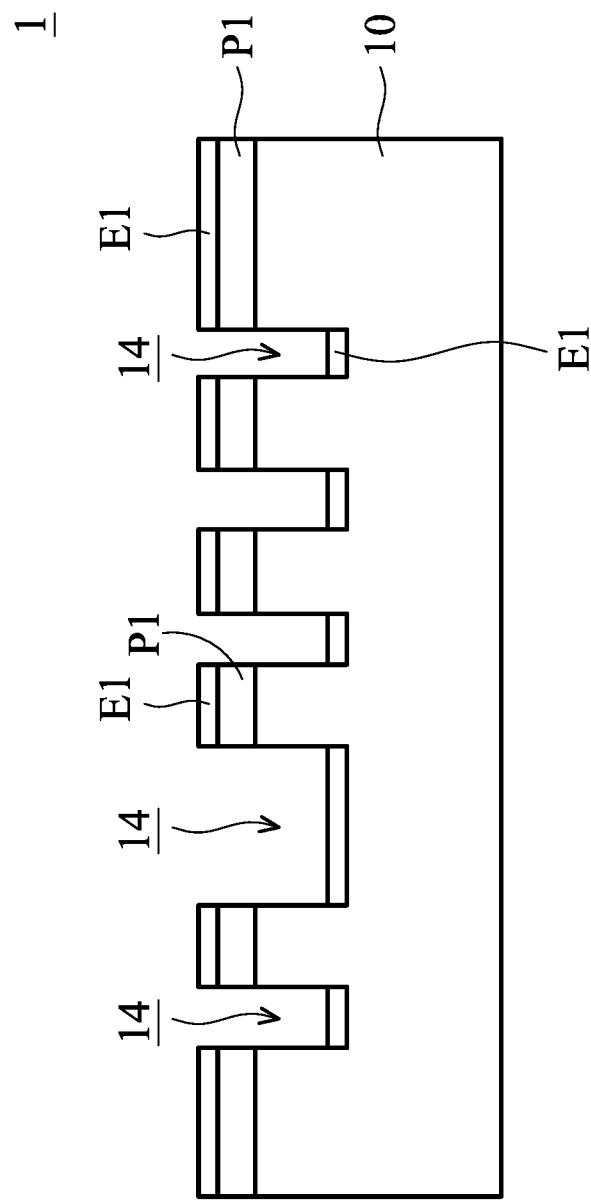

In step S103, as shown in FIG. 10B, an etching process is performed on the upper surface 11 of the first dielectric substrate 10 to form grooves 14. In step S105, a seed layer E1 is formed on the photoresist P1 and the first dielectric substrate 10. The seed layer E1 can be an adhesive layer. The materials of the seed layer E1 could include Mo or CU.

Figure 10D:
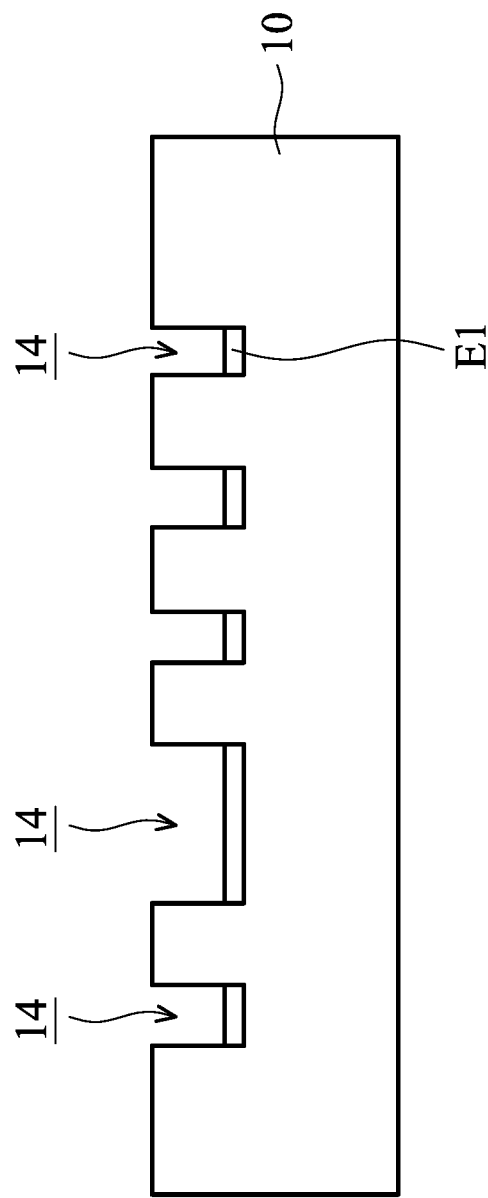
Figure 10E:
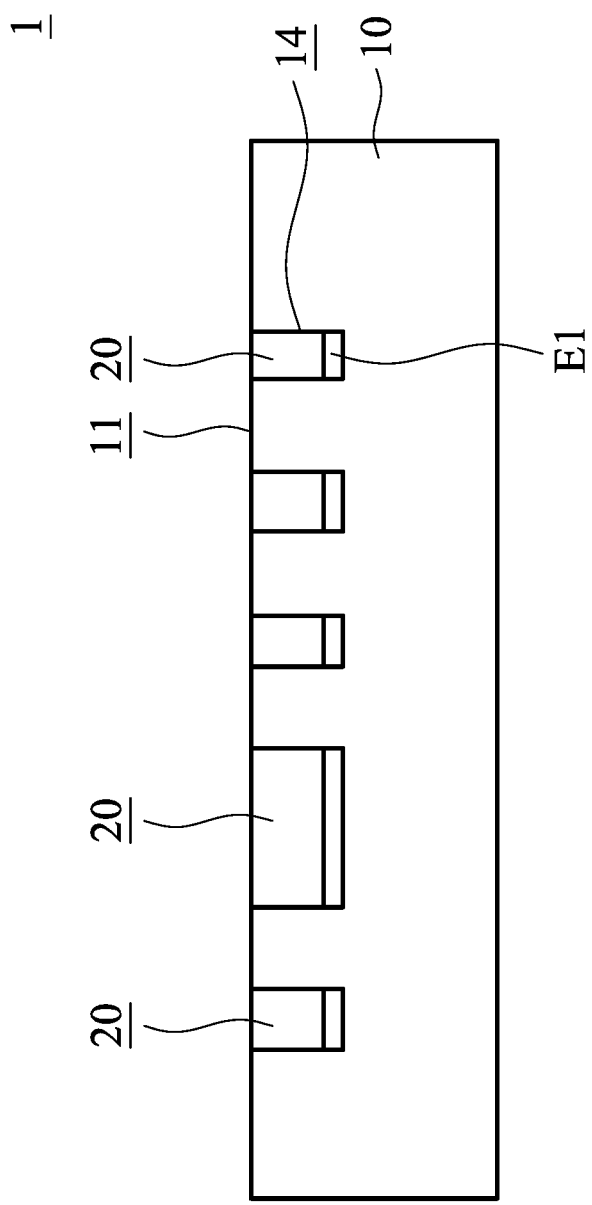

In step S107, as shown in FIG. 10D, the photoresist P1 is removed, and thus the seed layer E1 on the photoresist P1 is removed. In step S109, as shown in FIG. 10E, the first radiator 20 is formed on the seed layer E1 in the grooves 14. In some embodiments, the grooves 14 are filled with the first radiator 20. The first radiator 20 does not protrude over the opening of the grooves 14. In other words, the upper surface of the first radiator 20 is lower than the upper surface 11 of the first dielectric substrate 10, or the upper surface of the first radiator 20 is level with and the upper surface 11 of the first dielectric substrate 10. In some embodiments, the upper surface of the first radiator 20 may protrude slightly over the upper surface 11 of the first dielectric substrate 10. For example, the thickness of the first radiator 20 is greater than 0.5 times the depth of the grooves 14, and less than 1.5 times the depth of the grooves 14.

Figure 10F:
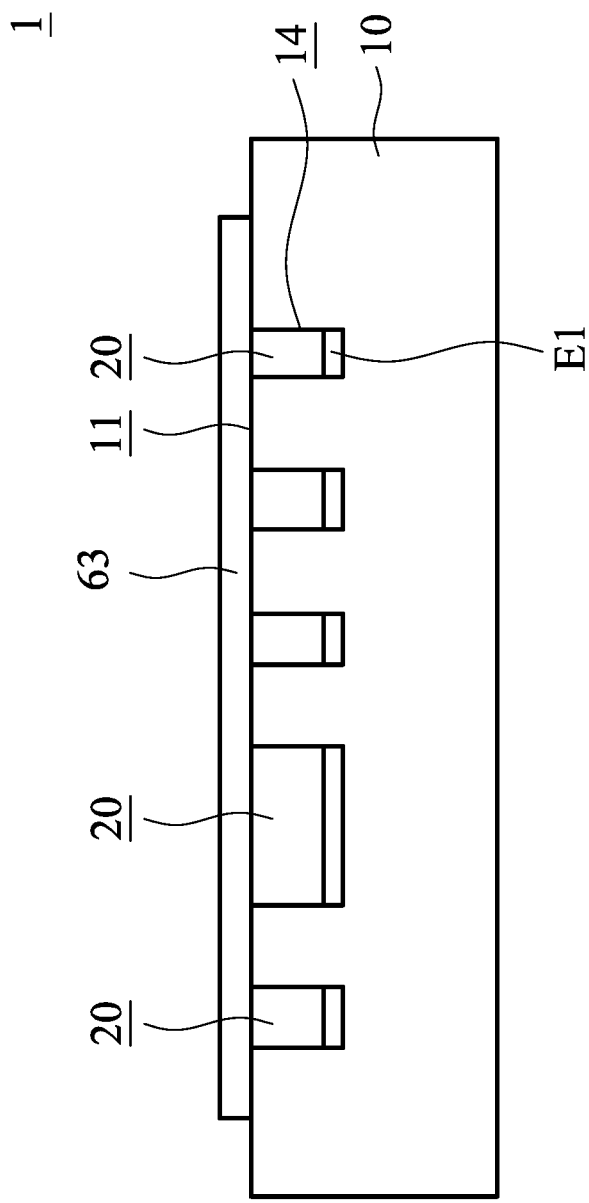

In step S111, as shown in FIG. 10F, the first alignment layer 63 is formed on the first dielectric substrate 10 and the first radiator 20. In some embodiments, the first alignment layer 63 is formed on the upper surface 11 of the first dielectric substrate 10 and the upper surface of the first radiator 20.

In this embodiment, since the upper surface of the first radiator 20 is level with the upper surface 11 of the first dielectric substrate 10, the first alignment layer 63 can be formed uniformly.

Figure 11:
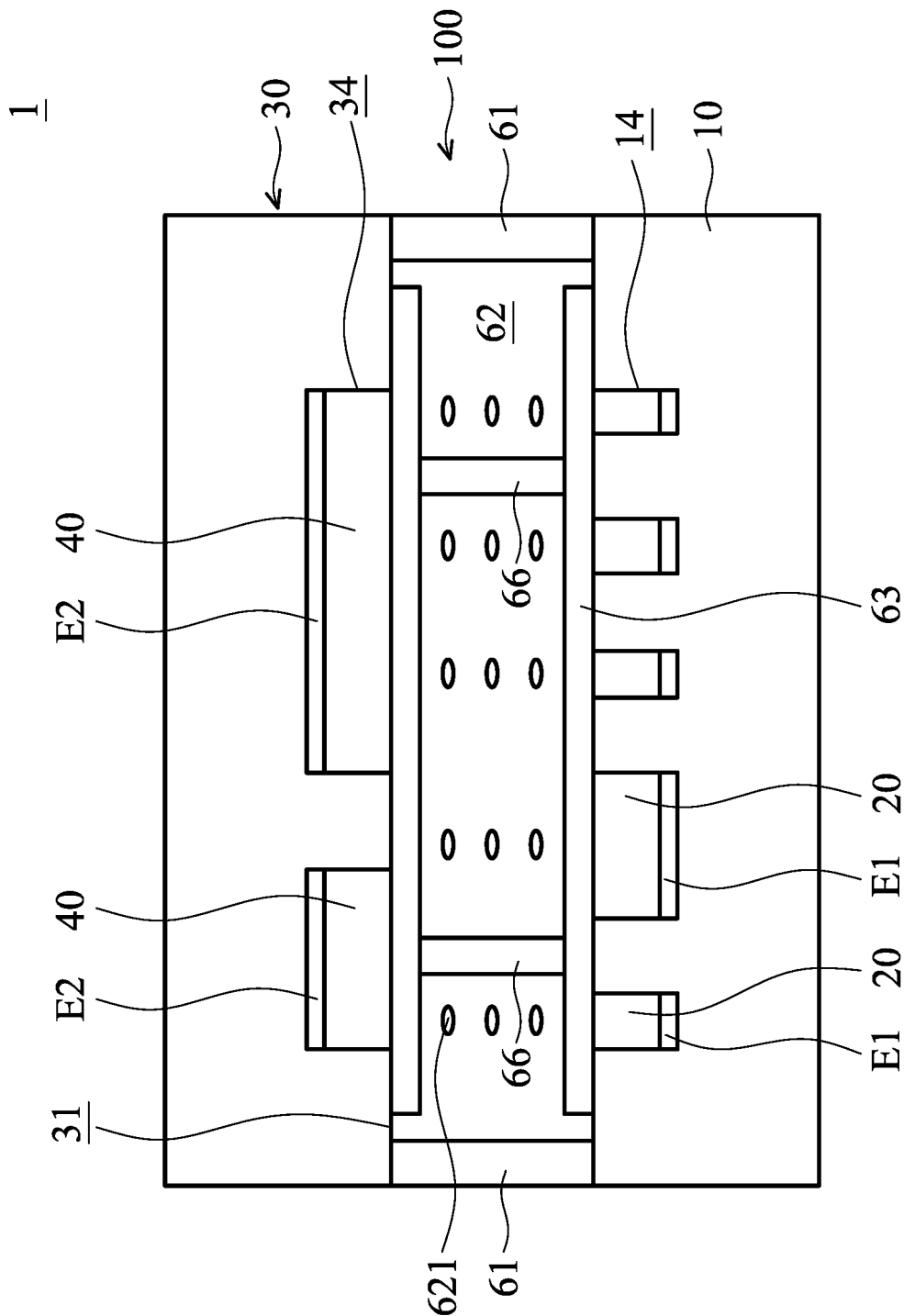
FIG. 11 is a schematic view of an antenna unit in accordance with a ninth embodiment of the present disclosure.

FIG. 11 is a schematic view of an antenna unit 1 in accordance with a ninth embodiment of the present disclosure. According to the described steps, grooves 34 are formed on the lower surface 31 of the second dielectric substrate 30. Afterwards, a seed layer E2 is formed on the bottom of the grooves 34, and the second radiator 40 is formed in the grooves 34 and on the seed layer E2. The seed layer E2 may be an adhesive layer. The materials of the seed layer E2 may include Mo or CU.

In some embodiments, the second radiator 40 is filled in the grooves 34. The second radiator 40 does not protrude over the opening of the grooves 34. In other words, the thickness of the second radiator 40 is lower than the depth of the grooves 34, or the lower surface of the second radiator 40 is level with the lower surface 31 of the second dielectric substrate 30. In some embodiments, the lower surface of the second radiator 40 may protrude slightly over the lower surface 31 of the second dielectric substrate 30. For example, the thickness of the second radiator 40 is greater than 0.5 times the depth of the grooves 34, and less than 1.5 times the depth of the grooves 34.

The second alignment layer 64 is formed on the second dielectric substrate 30 and the second radiator 40. Since the lower surface of the second radiator 40 and the lower surface 31 of the second dielectric substrate 30 are located on the same plane, the second alignment layer 64 can be formed uniformly.

Depending on the substantially flat first alignment layer 63 and/or second alignment layer 64, the control accuracy, orientation stability, and modulation range of the liquid-crystal units 621 are improved when the modulation structure 60 includes the liquid-crystal units 621.

Figure 12:
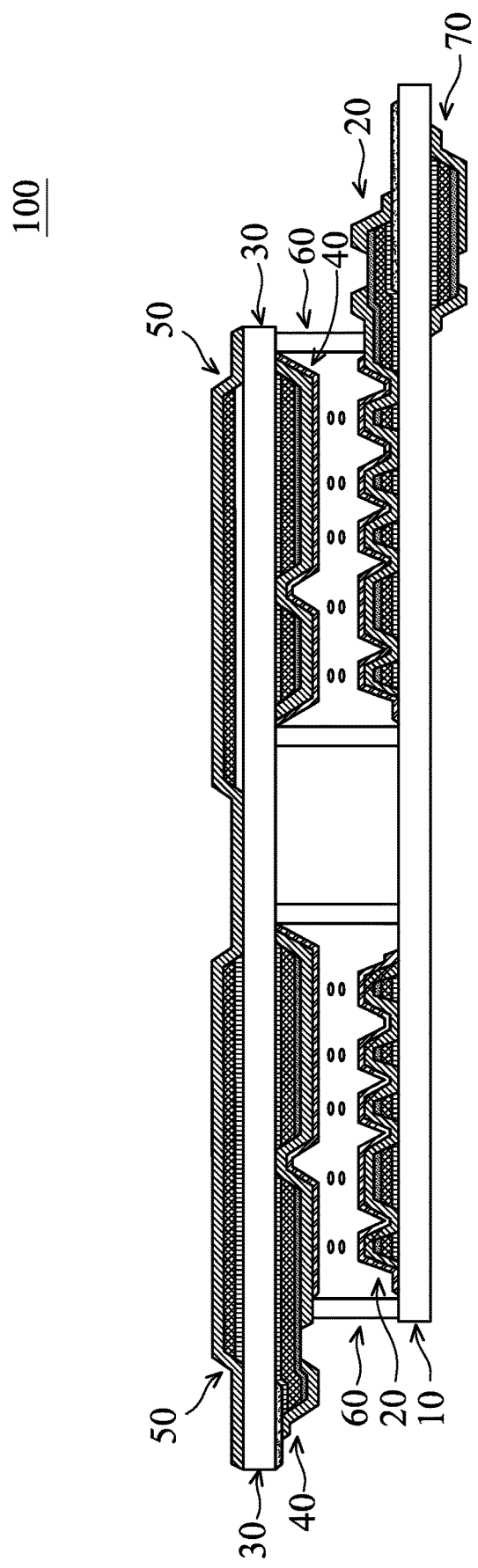
FIG. 12 is a schematic view of an antenna device in accordance with a tenth embodiment of the present disclosure.

FIG. 12 is a schematic view of an antenna device 100 in accordance with a tenth embodiment of the present disclosure. The antenna device 100 includes first radiation assemblies (10, 20, and 70) and second radiation assemblies (30, 40, and 50). The first radiators 20 are arranged on the first dielectric substrate 10 in an array, and the first radiator 20 are separated from each other. The second radiators 40 are arranged on the second dielectric substrate 30 in an array, and the second radiators 40 are separated from each other. The main radiators 50 are arranged on the second dielectric substrate 30 in an array, and the main radiators 50 are separated from each other. Moreover, the modulation structures 60 are located between the first radiators 20 and the second radiators 40, and the modulation structures 60 are separated from each other.

In this embodiment, the first radiation assemblies (10, 20, and 70) are disposed on the first dielectric substrate 10, and the second radiation assemblies (30, 40, and 50) are disposed on the second dielectric substrate 30.

In this embodiment, the first radiation assemblies (10, 20, and 70) and the second radiation assemblies (30, 40, and 50) form an antenna array. By inputting first control signals into each of the first radiators 20, and inputting a second control signal into each of the second radiators 40, the emitting range and direction of the main radiation signals can be modulated.

Figure 13:
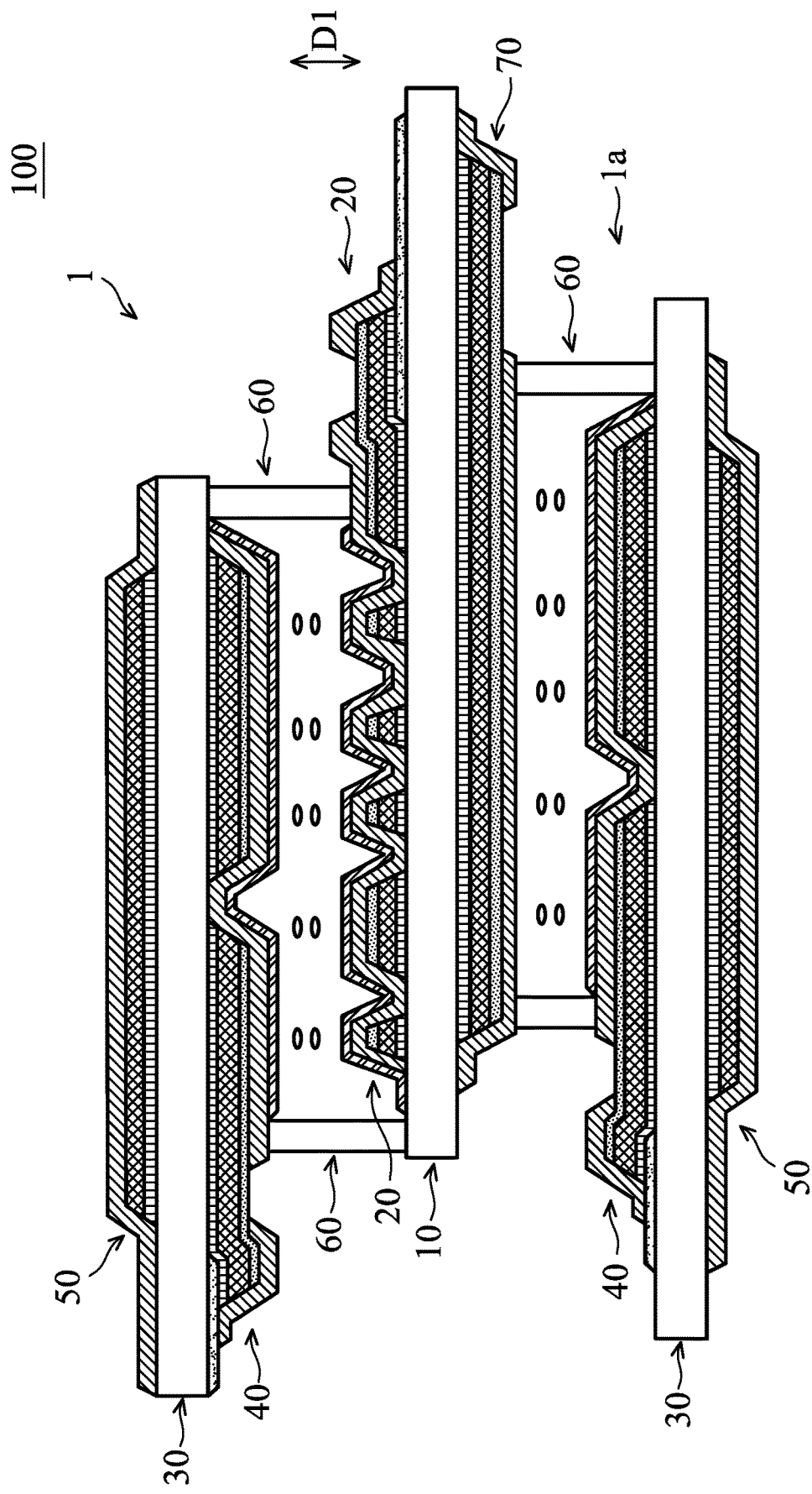
FIG. 13 is a schematic view of an antenna device in accordance with an eleventh embodiment of the present disclosure.

FIG. 13 is a schematic view of an antenna device 100 in accordance with an eleventh embodiment of the present disclosure. The antenna device 100 includes an antenna unit 1 and an antenna unit 1a. The antenna units 1 and 1a are stacked along the stacking direction D1. During the manufacturing of the stacked antenna units 1 and 1a, the upper antenna unit 1 and the second radiation assembly (30, 40, and 50) of the lower antenna unit 1a could be manufactured first. Next, the modulation structure 60 of the antenna unit 1a is formed between the second radiator 40 of the antenna unit 1a and the third radiator 70 of the antenna unit 1. Thus, the stacked antenna units 1 and 1a can be manufactured.

Since the main radiators 50 of the antenna units 1 and 1a face in two opposite directions, the antenna units 1 and 1a can emit main radiation signals from two opposite sides of the antenna units 1 and 1a.

Figure 14:
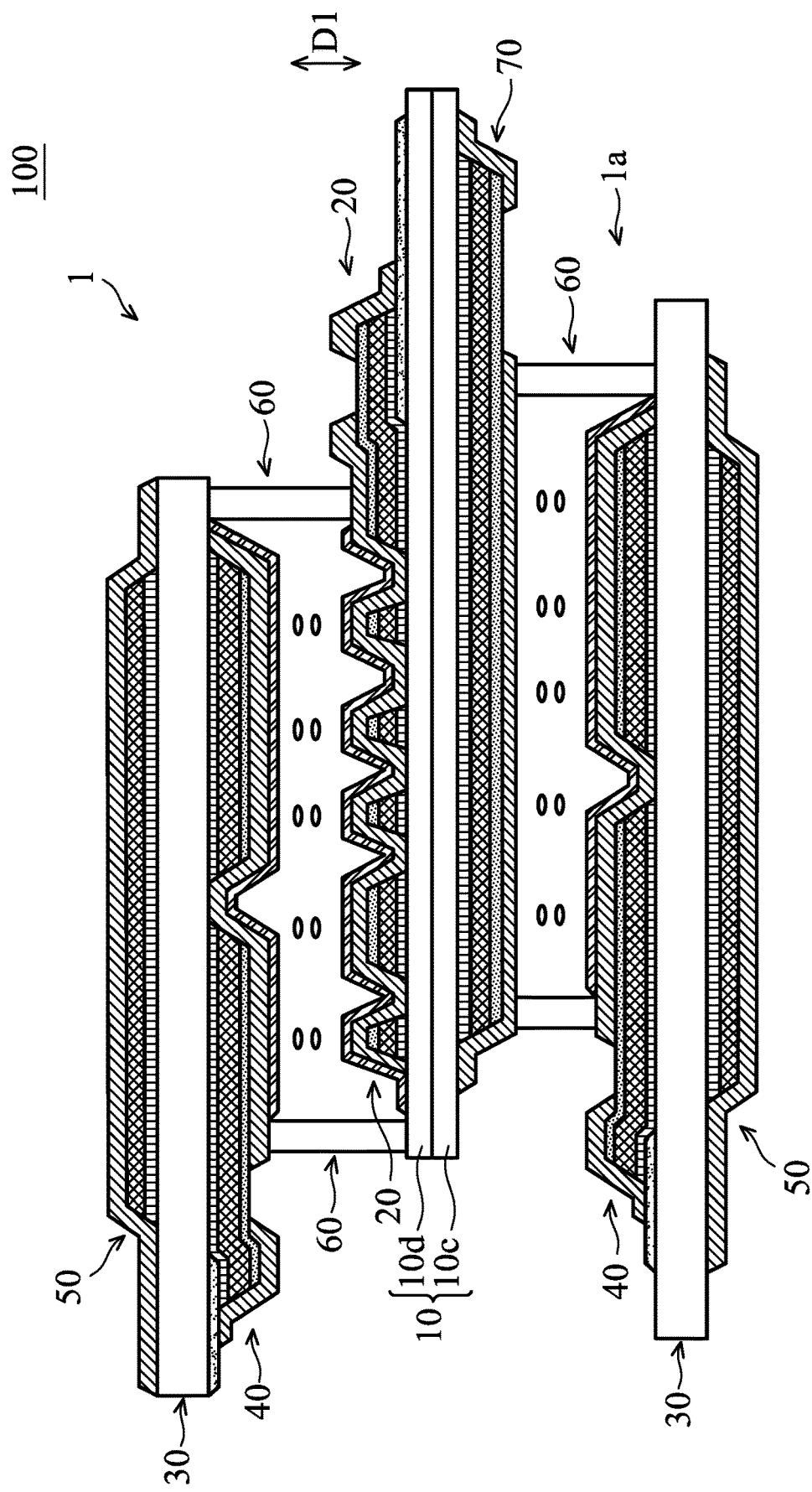
FIG. 14 is a schematic view of an antenna device in accordance with a twelfth embodiment of the present disclosure.

FIG. 14 is a schematic view of an antenna device 100 in accordance with a twelfth embodiment of the present disclosure. The antenna device 100 includes an antenna unit 1 and an antenna unit 1a. The antenna units 1 and 1a are stacked along the stacking direction D1. While manufacturing the stacked antenna units 1 and 1a, a number of antenna units 1 and 1a that are the same or similar can be manufactured first. Next, the thickness of the first dielectric substrate 10c of the lower antenna unit 1a is reduced, and the thickness of the first dielectric substrate 10d of the upper antenna unit 1 is reduced. Finally, the first dielectric substrate 10d of the upper antenna unit 1 is attached to the first dielectric substrate 10c of the lower antenna unit 1a.

By stacking a number of antenna units 1 and 1a along the stacking direction D1, the strength of the main radiation signals can be enhanced, or the main radiation signals can be emitted from two opposite sides of the antenna units 1 and 1a.

The disclosed features may be combined, modified, or replaced in any suitable manner in one or more disclosed embodiments, but are not limited to any particular embodiments.

While the disclosure has been described by way of example and in terms of preferred embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An antenna device comprising:
   a first dielectric substrate;
   a first radiator disposed on the first dielectric substrate, wherein the first radiator comprises a first radiation portion and a first connection portion connected to the first radiation portion, the first connection portion is configured to receive a first control signal;
   a second dielectric substrate disposed on the first radiator;
   a second radiator disposed between the first dielectric substrate and the second dielectric substrate, wherein the second radiator comprises a second radiation portion and a second connection portion connected to the second radiation portion, the second connection portion is configured to receive a second control signal;
   a main radiator, disposed on the second dielectric substrate; and
   a modulation structure located between the first radiation portion and the second radiation portion,
   wherein the first radiation portion, the modulation structure, and the second radiation portion are located in a central area, a first area is connected to a side of the central area, and a second area is connected to another side of the central area, wherein the first connection portion is located in the first area, and the second connection portion is located in the second area.

2. The antenna device as claimed in claim 1, wherein the first radiator further comprises:
   a first conductive signal layer disposed on the first dielectric substrate; and
   a first protective layer disposed on the first conductive signal layer.

3. The antenna device as claimed in claim 2, wherein the first protective layer comprises a first feeding area to expose a part of the first conductive signal layer, and the first feeding area is located in the first area.

4. The antenna device as claimed in claim 2, wherein the first radiator further comprises a first conductive control layer located between the first conductive signal layer and the first dielectric substrate, and the first conductive control layer is configured to receive the first control signal, wherein at least a part of the first conductive control layer is located in the first area.

5. The antenna device as claimed in claim 4, wherein at least another part of the first conductive control layer is located in the central area.

6. The antenna device as claimed in claim 4, wherein an equivalent resistance per unit length of the first conductive control layer is greater than an equivalent resistance per unit length of the first conductive signal layer.

7. The antenna device as claimed in claim 1, wherein the modulation structure comprises a liquid-crystal material.

8. The antenna device as claimed in claim 4, wherein the first radiator further comprises a first sub-protective layer disposed between the first conductive control layer and the first conductive signal layer,
   wherein the first radiator includes an invalid area, and a part of the first sub-protective layer passes through the first conductive control layer to connect to the first dielectric substrate in the invalid area.

9. The antenna device as claimed in claim 1, wherein the second radiator further comprises:
   a second protective layer disposed between the second dielectric substrate and the modulation structure; and
   a second conductive signal layer disposed between the second dielectric substrate and the second protective layer.

10. The antenna device as claimed in claim 9, wherein the second protective layer comprises a second feeding area to expose a part of the second conductive signal layer, and the second feeding area is located in the second area.

11. The antenna device as claimed in claim 9, wherein the second radiator further comprises a second conductive control layer located between the second conductive signal layer and the second dielectric substrate, the second conductive control layer is configured to receive the second control signal, wherein at least a part of the second conductive control layer is located in the second area.

12. The antenna device as claimed in claim 11, wherein the second radiator further comprises:
   a second sub-protective layer disposed between the second conductive control layer and the second conductive signal layer.

13. The antenna device as claimed in claim 1, wherein the modulation structure comprises:
   a seal wall connected to the first radiator and the second radiator; and
   a liquid-crystal material filled a space surrounded by the seal wall.

14. The antenna device as claimed in claim 13, wherein the modulation structure further comprises a filling material disposed in the space surrounded by the seal wall, and the liquid-crystal material is located between the filling material and the second radiator.

15. The antenna device as claimed in claim 14, wherein the modulation structure comprises a plurality of spacing elements located between the filling material and the second radiator.

16. The antenna device as claimed in claim 14, wherein the modulation structure further comprises a plurality spacing elements located between the first dielectric substrate and the second dielectric substrate.

17. The antenna device as claimed in claim 13, wherein an electric field is generated according to the first control signal and the second control signal, and the electric field is configured to control the angle of inclination of liquid-crystal units of the modulation structure.

18. The antenna device as claimed in claim 1, wherein the first dielectric substrate comprises a first lower substrate and a first upper substrate, the first upper substrate is disposed on the first lower substrate, and attached to the first lower substrate, and the first radiator is disposed on the first upper substrate.

19. The antenna device as claimed in claim 1, wherein the first dielectric substrate comprises a first groove, and the first radiator is located in the first groove.

20. The antenna device as claimed in claim 1, wherein the second dielectric substrate comprises a second groove, and the second radiator is located in the second groove.

* * * * *